US007502255B2

(12) United States Patent  (10) Patent No.: US 7,502,255 B2
Li  (45) Date of Patent: *Mar. 10, 2009

(54) METHOD FOR CACHE PAGE COPY IN A NON-VOLATILE MEMORY

(75) Inventor: Yan Li, Milpitas, CA (US)

(73) Assignee: Sandisk Corporation, Milpitas, CA (US)

( * ) Notice: Subject to any disclaimer, the term of this patent is extended or adjusted under 35 U.S.C. 154(b) by 42 days.

This patent is subject to a terminal disclaimer.

(21) Appl. No.: 11/683,356

(22) Filed: Mar. 7, 2007

(65) Prior Publication Data

US 2008/0219059 A1    Sep. 11, 2008

(51) Int. Cl.
*G11C 16/04* (2006.01)
(52) U.S. Cl. .................................. 365/185.03
(58) Field of Classification Search ............. 365/185.03
See application file for complete search history.

(56) References Cited

U.S. PATENT DOCUMENTS

| 5,070,032 | A | 12/1991 | Yuan et al. |
| 5,095,344 | A | 3/1992 | Harari et al. |
| 5,172,338 | A | 12/1992 | Mehrotra et al. |
| 5,313,421 | A | 5/1994 | Guterman et al. |
| 5,315,541 | A | 5/1994 | Harari et al. |
| 5,343,063 | A | 8/1994 | Yuan et al. |
| 5,570,315 | A | 10/1996 | Tanaka et al. |
| 5,595,924 | A | 1/1997 | Yuan et al. |
| 5,661,053 | A | 8/1997 | Yuan |
| 5,768,192 | A | 6/1998 | Eitan |
| 5,903,495 | A | 5/1999 | Takeuchi et al. |

(Continued)

FOREIGN PATENT DOCUMENTS

EP    1 326 257 A2    7/2003

(Continued)

OTHER PUBLICATIONS

EPO/ISA, "Notification of Transmittal of the International Search Report and the Written Opinion of the International Searching Authority, or the Declaration," corresponding in International Patent Application No. PCT/US2008/055449, mailed on Jun. 27, 2008, 11 pages.

(Continued)

*Primary Examiner*—Huan Hoang
*Assistant Examiner*—Jay Radke
(74) *Attorney, Agent, or Firm*—Davis Wright Tremaine LLP

(57) ABSTRACT

A non-volatile memory and methods include cached page copying using a minimum number of data latches for each memory cell. Multi-bit data is read in parallel from each memory cell of a group associated with a first word line. The read data is organized into multiple data-groups for shuttling out of the memory group-by-group according to a predetermined order for data-processing. Modified data are returned for updating the respective data group. The predetermined order is such that as more of the data groups are processed and available for programming, more of the higher programmed states are decodable. An adaptive full-sequence programming is performed concurrently with the processing. The programming copies the read data to another group of memory cells associated with a second word line, typically in a different erase block and preferably compensated for perturbative effects due to a word line adjacent the first word line.

24 Claims, 21 Drawing Sheets

U.S. PATENT DOCUMENTS

| | | | |
|---|---|---|---|
| 6,011,725 | A | 1/2000 | Eitan |
| 6,046,935 | A | 4/2000 | Takeuchi et al. |
| 6,222,762 | B1 | 4/2001 | Guterman et al. |
| 6,266,273 | B1 | 7/2001 | Conley et al. |
| 6,657,891 | B1 | 12/2003 | Shibata et al. |
| 7,206,230 | B2 * | 4/2007 | Li et al. ............... 365/185.22 |
| 7,224,614 | B1 | 5/2007 | Chan |
| 2004/0109357 | A1 | 6/2004 | Cernea et al. |
| 2005/0257120 | A1 * | 11/2005 | Gorobets et al. ............ 714/763 |
| 2006/0136656 | A1 * | 6/2006 | Conley et al. ............... 711/103 |
| 2006/0136687 | A1 | 6/2006 | Conley et al. |
| 2006/0140007 | A1 | 6/2006 | Cernea et al. |
| 2006/0221696 | A1 | 10/2006 | Li |
| 2006/0221704 | A1 | 10/2006 | Li et al. |
| 2006/0221714 | A1 | 10/2006 | Li et al. |
| 2006/0233026 | A1 | 10/2006 | Li |
| 2007/0002615 | A1 * | 1/2007 | Lee et al. ............... 365/185.03 |
| 2007/0109867 | A1 * | 5/2007 | Li et al. ............... 365/185.22 |
| 2007/0206421 | A1 | 9/2007 | Mokhlesi |
| 2007/0283081 | A1 * | 12/2007 | Lasser ...................... 711/103 |
| 2008/0158973 | A1 | 7/2008 | Mui et al. |

FOREIGN PATENT DOCUMENTS

| | | |
|---|---|---|
| EP | 1 326 257 A3 | 7/2003 |
| WO | WO 2007/131127 A2 | 11/2007 |
| WO | WO 2007/131127 A3 | 11/2007 |

OTHER PUBLICATIONS

Chan, "Methods for Improved Program-Verify Operations in Non-Volatile Memories," U.S. Appl. No. 11/323,596, filed Dec. 29, 2005, 66 pages.

Eitan et al., "NROM: A Novel Localized Trapping 2-Bit Nonvolatile Memory Cell," IEEE Electron Device Letters, vol. 21, No. 11, Nov. 2000, pp. 543-545.

Mokhlesi et al., " Read Operation for non-Volatile Storage with Compensation for Coupling," U.S. Appl. No. 11/384,057, filed on Mar. 17, 2006.

Mui et al., "Complete Word Line Look Ahead with Efficient Data Latch Assignment in Non-Volatile Memory Read Operation," U.S. Appl. No. 11/617,544, filed on Dec. 28, 2006.

USPTO, "Notice of Allowance and Fee(s) Due," corresponding U.S. Appl. No. 11/683,365 on Aug. 8, 2008.

* cited by examiner

Logical-Page-by-Logical-Page Programming
(2-bit LM Gray Code)

Full-Sequence Programming
(2-bit LM Gray Code)

Lower Page Read (LM Gray Code)

Upper Page Read (LM Gray Code)

**Logical Page Programming Sequence
to Minimize WL-WL Yupin Effect**

PAGE COPY WITH ECC

Adaptive Full-Sequence Programming (2-bit LM Gray Code)

METHOD FOR CACHE PAGE COPY IN A NON-VOLATILE MEMORY

CROSS REFERENCE TO RELATED APPLICATION

This application is also related to the following U.S. patent application: U.S. application Ser. No. 11/683,365, entitled "Non-Volatile Memory With Cache Page Copy" by Yan Li, filed on Mar. 7, 2007, U.S. patent application Ser. No. 2008/0219057 A1.

FIELD OF THE INVENTION

This invention relates generally to non-volatile semiconductor memory such as electrically erasable programmable read-only memory (EEPROM) and flash EEPROM, and specifically to cache operations based on efficient utilization of latch structures in memory operations such as copying a page from one memory location to another.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile and retains its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell. When the threshold voltage is partitioned into two distinct regions, each memory cell will be able to store one bit of data. Similarly, when the threshold voltage window is partitioned into more than two distinct regions, each memory cell will be able to store more than one bit of data.

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current IREF). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

The memory devices typically comprise one or more memory chips that may be mounted on a card. Each memory chip comprises an array of memory cells supported by peripheral circuits such as decoders and erase, write and read circuits. The more sophisticated memory devices operate with an external memory controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also non-volatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

Therefore there is a general need for high capacity and high performance non-volatile memory. In particular, there is a need to have a high capacity nonvolatile memory able to conduct memory operations in large blocks with high performance and efficient utilization of device resources.

SUMMARY OF INVENTION

According to a general aspect of the present invention, an efficient utilization of a minimum number of n+1 data latches for each memory cell enables an n-bit memory to implement efficient data relocation or "page cache copy". Furthermore, the same configuration of data latches also allows read with compensation for data stored in adjacent word line. Thus, a 2-bit memory will only need 3 data latches per memory cell to implement read with compensation for data stored in adjacent word line and for efficient data relocation. Similarly, a 3-bit memory will only need 4 data latches per memory cell to implement read with compensation for data stored in adjacent word line and for efficient data relocation.

For a page memory cells each storing n-bit data to be relocated, this is accomplished by reading the page of n-bit data and latching into a corresponding page of n-bit latches such that n logical pages of single bit data, one from each of the n-bit data are latched, shuttling in a predetermined order each of the n logical data pages page-by-page out for data-processing and returning any modified bits back to originating latches while simultaneously programming page-by-page the processed-data as it returns. In this way, at least some of the time for toggling the data out and back can be hidden behind the write operation, thereby improving the performance for page copying.

In particular, the logical data pages are shuttled for data-processing in the predetermined order such that the first data page available for programming will allow programming to start from the erased state up to a given programmed state even when all the bits of the n-bit code are not available to resolve all memory states. Similarly, an additional available page will allow programming to continue to even higher programmed states. When all the code bits become available, the programming can be completed since the target state of every memory cell of the page is defined. Thus, programming is performed in an adaptive full-sequence mode in which programming can commence as far as the available bits will allow and finally complete when all the code bits are available.

The invention has the advantages of improving performance in at least four aspects which are inter-related.

First, programming in the adaptive full-sequence mode allows the programming voltage applied to a word line to be a monotonically increasing function. Programming can be done in one pass from a lowest memory state to a highest memory state across the entire threshold window. This is in contrast to a multi-pass programming where the programming voltage will have to restart back from an initial programming voltage at the beginning of each pass.

Secondly, the adaptive feature allows programming to start even when not all the code bits are available to fully resolve the memory states. Programming can start as soon as even one bit of the multi-bit code is available for each memory cell of the page.

Thirdly, since programming on each memory cell can be done with progressive addition of a bit at a time, the first-bit data group can be used to program the group of memory cells while the second-bit data group are getting ready by being data-processed at the same time. Thus, the data-processing period can be hidden behind the programming time. It will be seen that the inventive cache page copy scheme allows, for an n-bit code, n−1 data-processing operations to be hidden behind programming time. For example, employing a 2-bit code, one data-processing operation period is saved. For a 3-bit code, two data-processing operation periods are saved.

Finally, even with look-ahead correction for the perturbative effect due to data subsequently programmed on a neighboring word line, the inventive cache page copy scheme can be implemented with a minimum of data latches. For an n-bit memory, the number of data latches is n+1 per memory cell.

Additional features and advantages of the present invention will be understood from the following description of its preferred embodiments, which description should be taken in conjunction with the accompanying drawings.

DETAILED DESCRIPTION OF THE PREFERRED EMBODIMENTS

Memory System

FIG. 1 to FIG. 9 illustrate example memory systems in which the various aspects of the present invention may be implemented.

FIG. 10 to FIG. 17 illustrate examples of programming and reading techniques for the memory systems.

FIG. 18 to FIG. 21 illustrate embodiments of the cache page copy techniques of the present invention.

Figure 1:
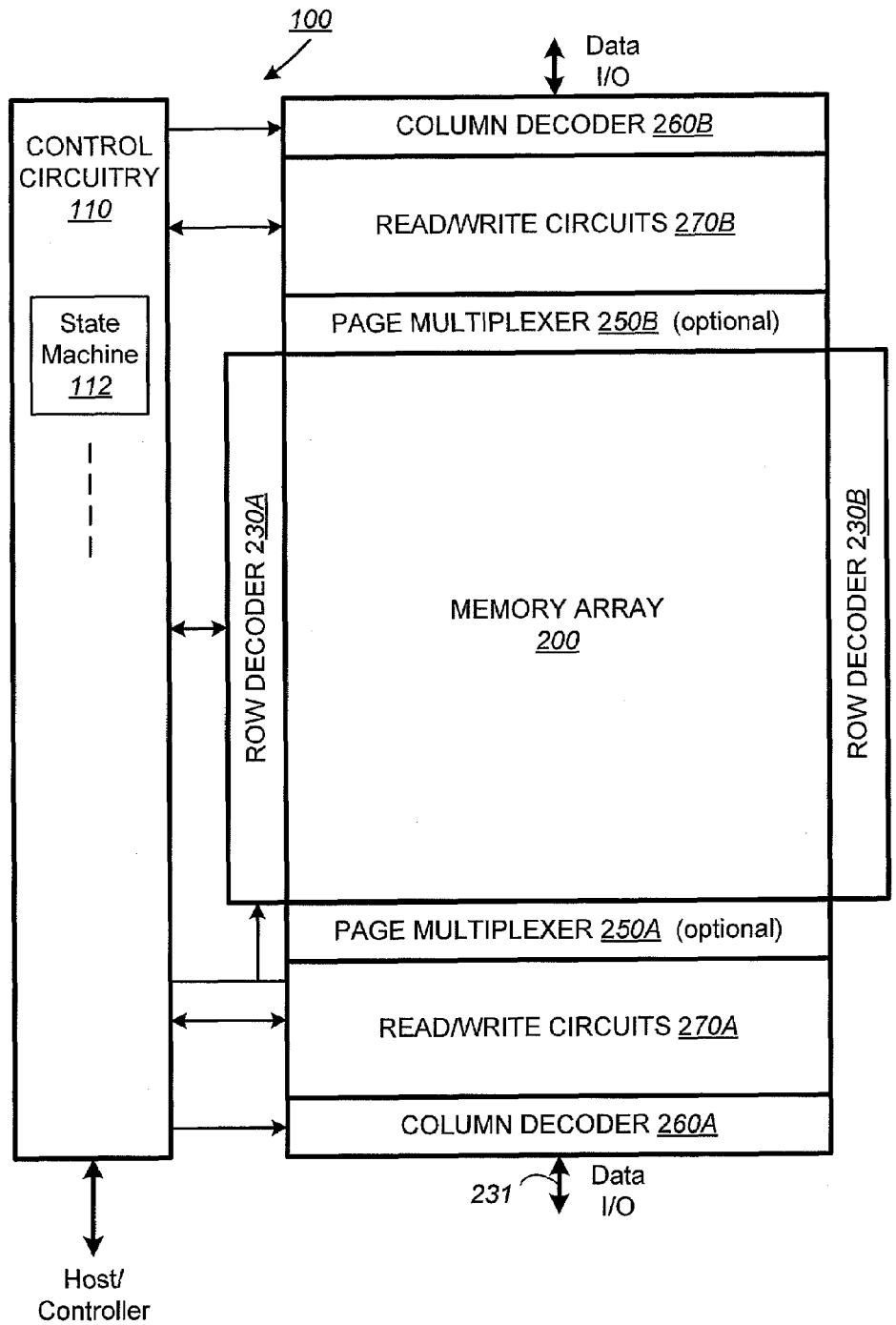
FIG. 1 illustrates schematically the functional blocks of a non-volatile memory chip in which the present invention may be implemented.

FIG. 1 illustrates schematically the functional blocks of a non-volatile memory chip in which the present invention may be implemented. The memory chip 100 includes a two-dimensional array of memory cells 200, control circuitry 110, and peripheral circuits such as decoders, read/write circuits and multiplexers.

Figure 4:
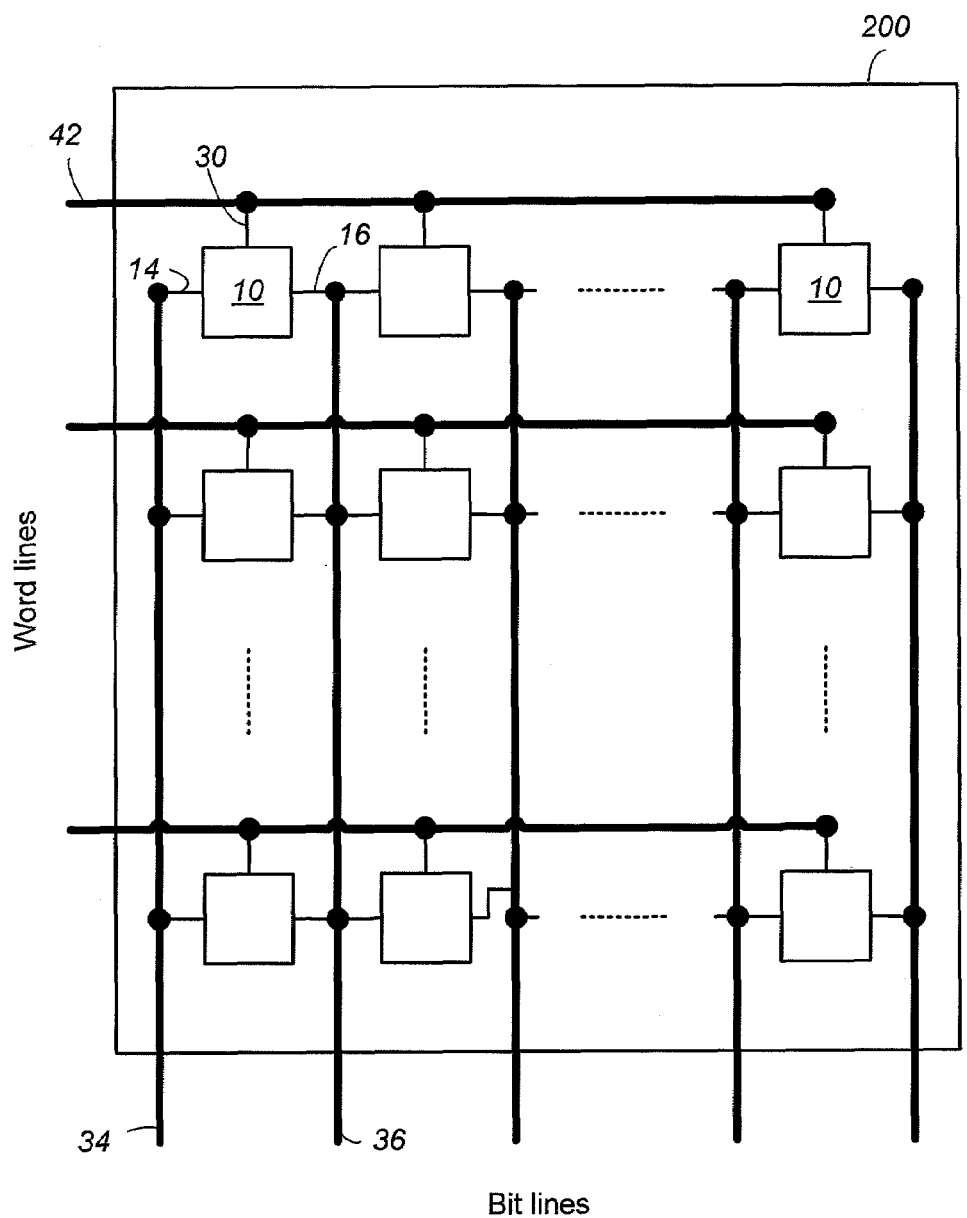
FIG. 4 illustrates an example of an NOR array of memory cells.

The memory array 200 is addressable by word lines via row decoders 230 (split into 230A, 230B) and by bit lines via column decoders 260 (split into 260A, 260B) (see also FIGS. 4 and 5.) The read/write circuits 270 (split into 270A, 270B) allow a page of memory cells to be read or programmed in parallel. A data I/O bus 231 is coupled to the read/write circuits 270.

In a preferred embodiment, a page is constituted from a contiguous row of memory cells sharing the same word line. In another embodiment, where a row of memory cells are partitioned into multiple pages, block multiplexers 250 (split into 250A and 250B) are provided to multiplex the read/write circuits 270 to the individual pages. For example, two pages, respectively formed by odd and even columns of memory cells are multiplexed to the read/write circuits.

FIG. 1 illustrates a preferred arrangement in which access to the memory array 200 by the various peripheral circuits is implemented in a symmetric fashion, on opposite sides of the array so that the densities of access lines and circuitry on each side are reduced in half. Thus, the row decoder is split into row decoders 230A and 230B and the column decoder into column decoders 260A and 260B. In the embodiment where a row of memory cells are partitioned into multiple pages, the page multiplexer 250 is split into page multiplexers 250A and 250B. Similarly, the read/write circuits 270 are split into read/write circuits 270A connecting to bit lines from the bottom and read/write circuits 270B connecting to bit lines from the top of the array 200. In this way, the density of the read/write modules, and therefore that of the sense modules 380, is essentially reduced by one half.

The control circuitry 110 is an on-chip controller that cooperates with the read/write circuits 270 to perform memory operations on the memory array 200. The control circuitry 110 typically includes a state machine 112 and other circuits such as an on-chip address decoder and a power control module (not shown explicitly). The state machine 112 provides chip level control of memory operations. The control circuitry is in communication with a host via an external memory controller.

The memory array 200 is typically organized as a two-dimensional array of memory cells arranged in rows and columns and addressable by word lines and bit lines. The array can be formed according to an NOR type or an NAND type architecture.

Figure 2:
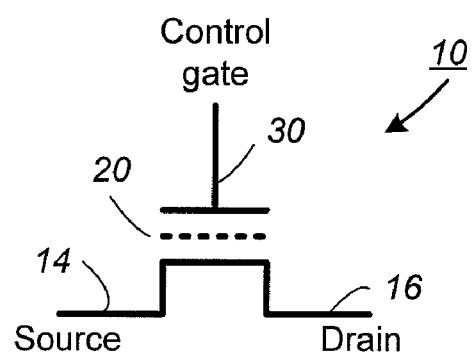
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

Figure 3:
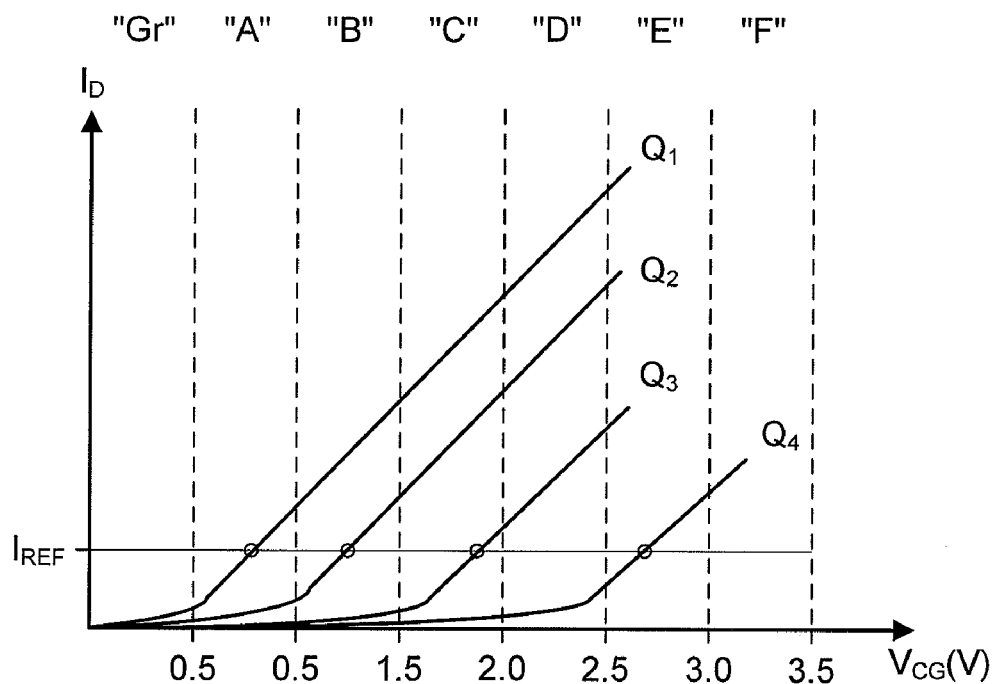
FIG. 3 illustrates the relation between the source-drain current $I_D$ and the control gate voltage $V_{CG}$ for four different charges Q1-Q4 that the floating gate may be selectively storing at any one time.

FIG. 3 illustrates the relation between the source-drain current ID and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven possible memory states "Gr", "A", "B", "C", "D", "E", "F", respectively representing one erased and six programmed states may be demarcated by partitioning the threshold window into five regions in interval of 0.5V each. For example, if a reference current, IREF of 2 µA is used as shown, then the cell programmed with Q1 may be considered to be in a memory state "A" since its curve intersects with $I_{REF}$ in the region of the threshold window demarcated by VCG=0.5V and 1.0V. Similarly, Q4 is in a memory state "E".

As can be seen from the description above, the more states a memory cell is made to store, the more finely divided is its threshold window. This will require higher precision in programming and reading operations in order to be able to achieve the required resolution.

FIG. 4 illustrates an example of an NOR array of memory cells. In the memory array 200, each row of memory cells are connected by their sources 14 and drains 16 in a daisy-chain manner. This design is sometimes referred to as a virtual ground design. The cells 10 in a row have their control gates 30 connected to a word line, such as word line 42. The cells in a column have their sources and drains respectively connected to selected bit lines, such as bit lines 34 and 36.

Figure 5A:
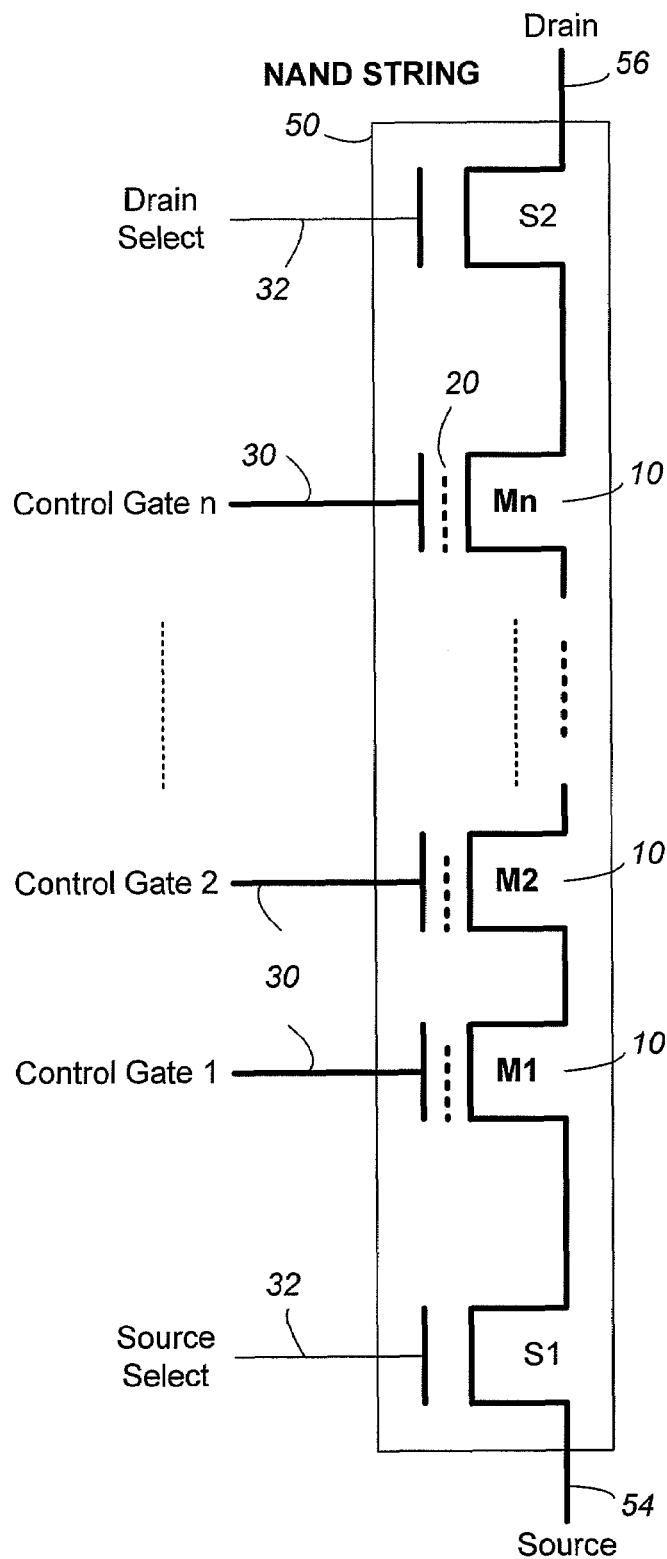
FIG. 5A illustrates schematically a string of memory cells organized into an NAND string.

FIG. 5A illustrates schematically a string of memory cells organized into an NAND string. An NAND string 50 comprises of a series of memory transistors M1, M2, . . . Mn (e.g., n=4, 8, 16 or higher) daisy-chained by their sources and drains. A pair of select transistors S1, S2 controls the memory transistors chain's connection to the external via the NAND string's source terminal 54 and drain terminal 56 respectively. In a memory array, when the source select transistor S1 is turned on, the source terminal is coupled to a source line (see FIG. 5B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor provides control over read and write operations. As will be seen in FIG. 5B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within an NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effective created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 5B:
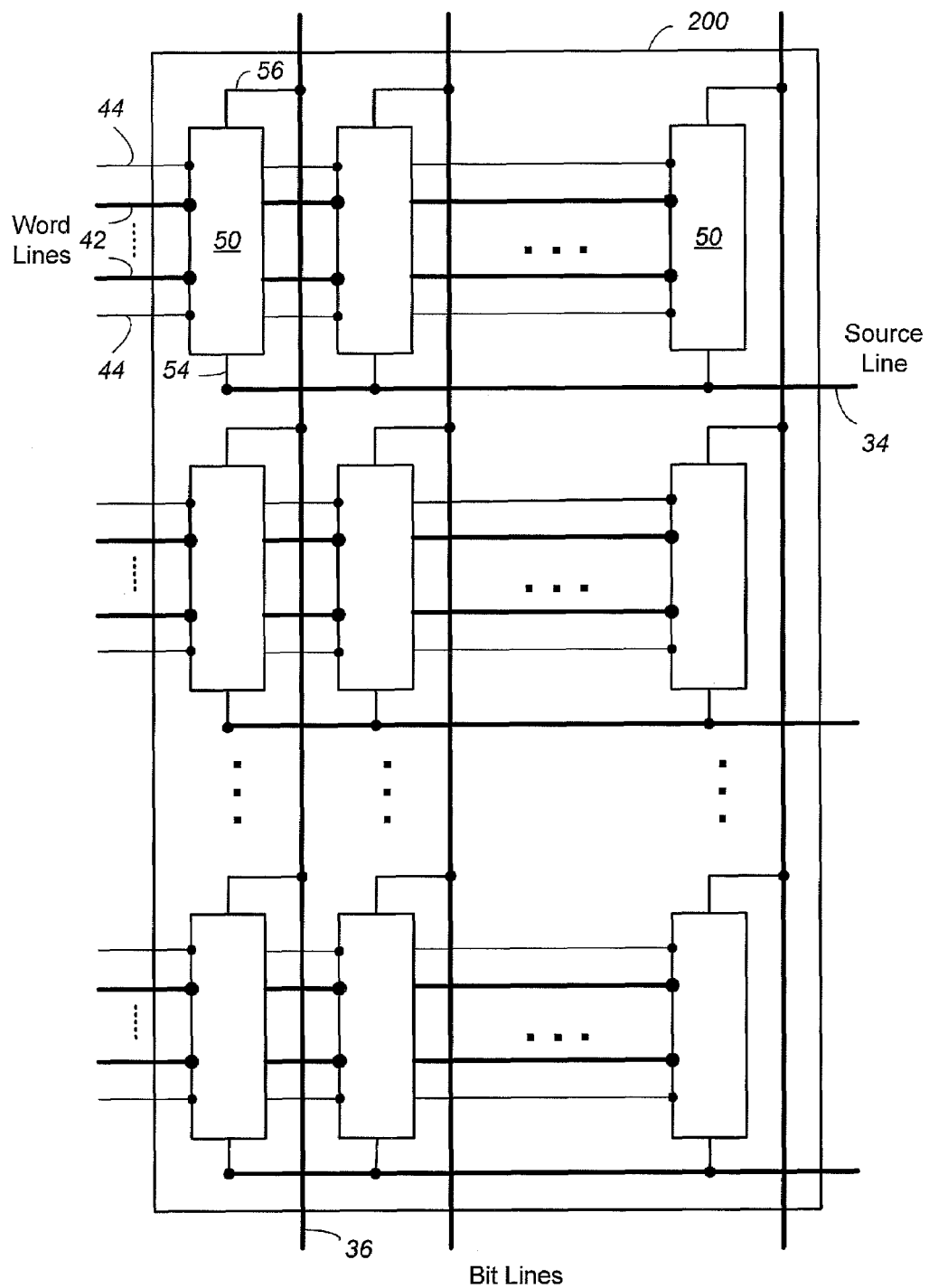
FIG. 5B illustrates an example of an NAND array 200 of memory cells, constituted from NAND strings 50 such as that shown in FIG. 5A.

FIG. 5B illustrates an example of an NAND array 200 of memory cells, constituted from NAND strings 50 such as that shown in FIG. 5A. Along each column of NAND strings, a bit line such as bit line 36 is coupled to the drain terminal 56 of each NAND string. Along each bank of NAND strings, a source line such as source line 34 is couple to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings. When a memory transistor within a NAND string is being read, the remaining memory transistors in the string are turned on hard via their associated word lines so that the current flowing through the string is essentially dependent upon the level of charge stored in the cell being read.

Figure 6:
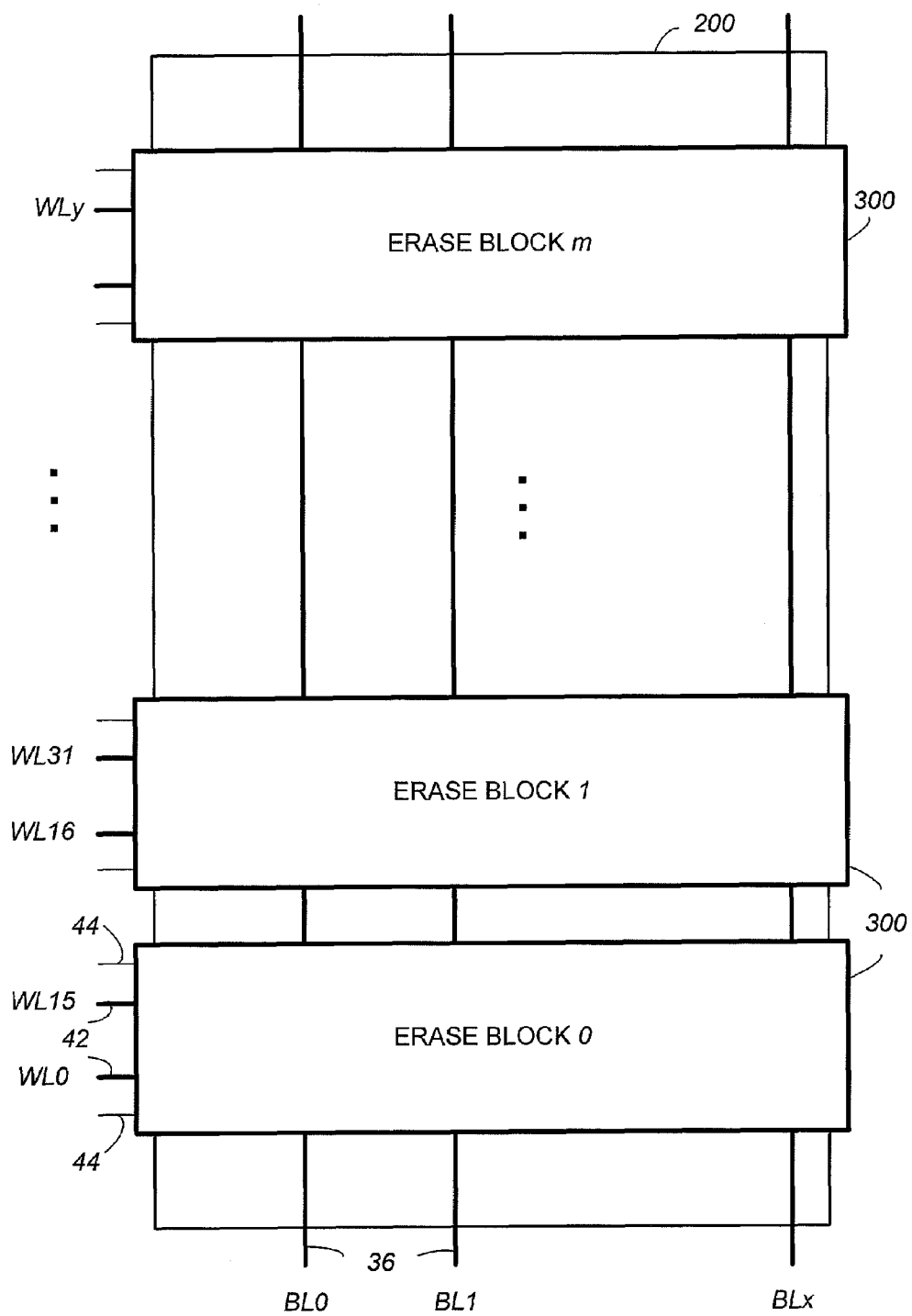
FIG. 6 illustrates schematically, an example of a memory array organized in erasable blocks.

FIG. 6 illustrates schematically, an example of a memory array organized in erasable blocks. Programming of charge storage memory devices can only result in adding more charge to its charge storage elements. Therefore, prior to a program operation, existing charge in charge storage element of a memory cell must be removed (or erased). A non-volatile memory such as EEPROM is referred to as a "Flash" EEPROM when an entire array of cells 200, or significant groups of cells of the array, is electrically erased together (i.e., in a flash). Once erased, the group of cells can then be reprogrammed. The group of cells erasable together may consist of one or more addressable erase unit 300. The erase unit or block 300 typically stores one or more pages of data, the page being a minimum unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in with it is stored.

In the example shown in FIG. 6, individual memory cells in the memory array 200 are accessible by word lines 42 such as WL0-WLy and bit lines 36 such as BL0-BLx. The memory is organized into erase blocks, such as erase blocks 0, 1, . . . m. Referring also to FIGS. 5A and 5B, if the NAND string 50 contains 16 memory cells, then the first bank of NAND strings in the array will be accessible by select lines 44 and word lines 42 such as WL0 to WL15. The erase block 0 is organized to have all the memory cells of the first bank of NAND strings erased together. In another memory architecture, more than one bank of NAND strings may be erased together.

Figure 7:
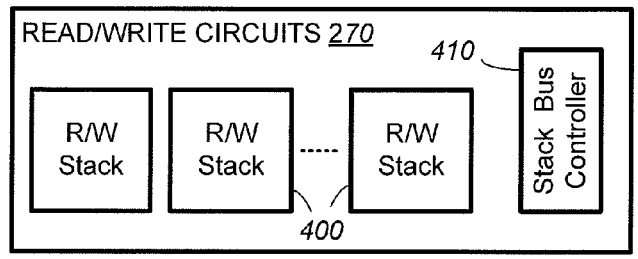
FIG. 7 illustrates schematically a preferred arrangement of the read/write circuits shown in FIG. 1.

FIG. 7 illustrates schematically a preferred arrangement of the read/write circuits shown in FIG. 1. The read/write circuits 270 is implemented as a bank of partitioned read/write stacks 400 and allows a group (also referred to as a "page") of memory cells to be read or programmed in parallel. As described earlier, the memory architecture is such that a set of read/write circuits services a corresponding set of memory cells in parallel. As will be seen in FIG. 8, each read/write stack 400 is a grouping of read/write circuits for servicing a subset of the page. If there are p memory cells in a page, each stack services a subset of k memory cells. The operations of the read/write stacks are controlled by a stack controller 410.

Figure 8:
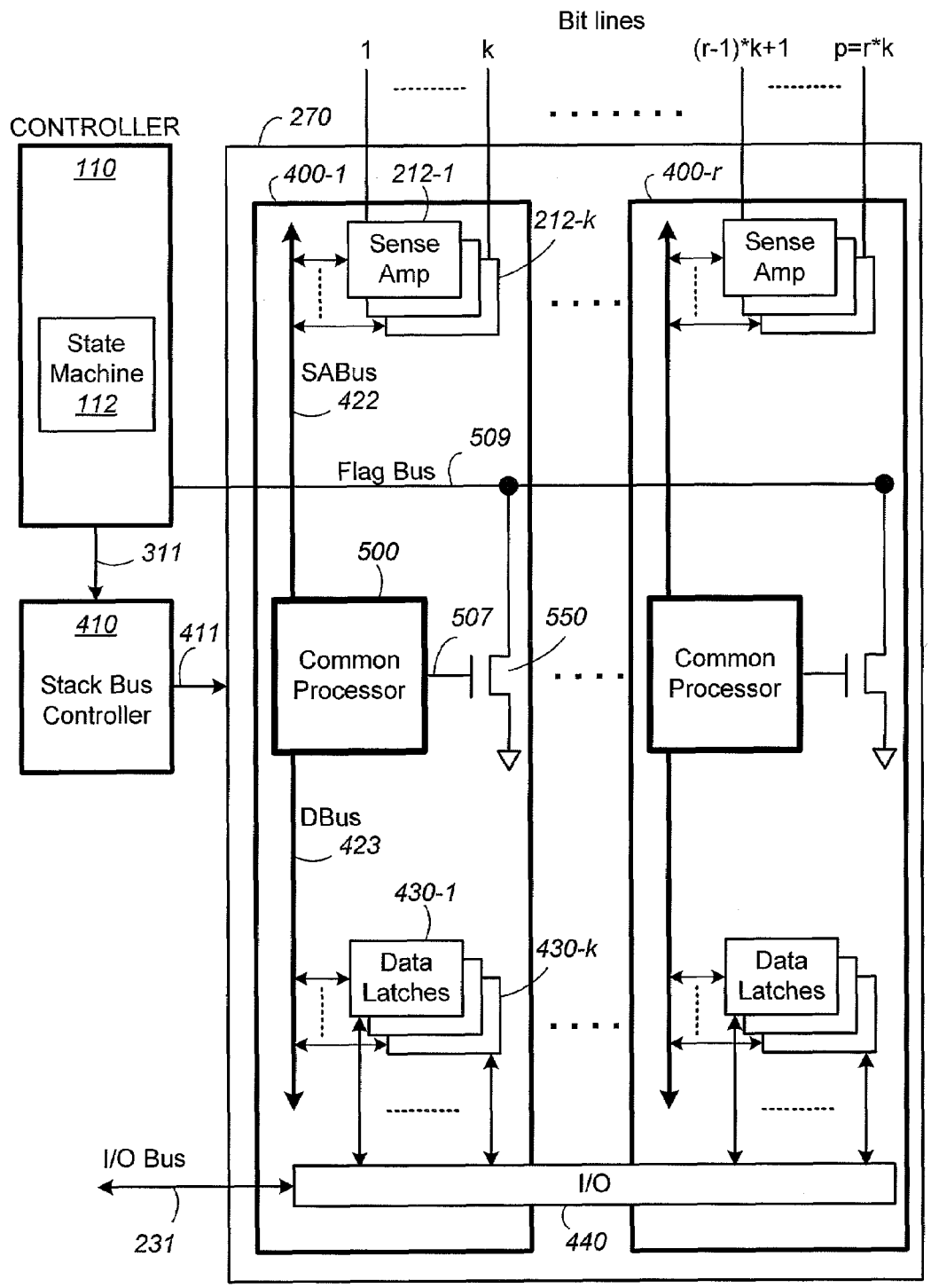
FIG. 8 illustrates the arrangement of the read/write stacks among the read/write circuits shown in FIG. 7.

FIG. 8 illustrates the arrangement of the read/write stacks among the read/write circuits shown in FIG. 7. Each read/write stack 400 operates on a group of k bit lines in parallel. If a page has p=r*k bit lines, there will be r read/write stacks, 400-1, ..., 400-r.

The entire bank of partitioned read/write stacks 400 operating in parallel allows a block (or page) of p cells along a row to be read or programmed in parallel. Thus, there will be p read/write modules for the entire row of cells. As each stack is serving k memory cells, the total number of read/write stacks in the bank is therefore given by r=p/k. For example, if r is the number of stacks in the bank, then p=r*k. One example memory array may have p=512 bytes (512×8 bits), k=8, and therefore r=512. In the preferred embodiment, the block is a run of the entire row of cells. In another embodiment, the block is a subset of cells in the row. For example, the subset of cells could be one half of the entire row or one quarter of the entire row. The subset of cells could be a run of contiguous cells or one every other cell, or one every predetermined number of cells.

Each read/write stack, such as 400-1, essentially contains a stack of sense amplifiers 212-1 to 212-k servicing a segment of k memory cells in parallel. A preferred sense amplifier is disclosed in United States Patent Publication No. 2004-0109357-A1, the entire disclosure of which is hereby incorporated herein by reference.

The stack bus controller 410 provides control and timing signals to the read/write circuit 370 via lines 411. The stack bus controller is itself dependent on the memory controller 110 via lines 311. Communication among each read/write stack 400 is effected by lines 411 and controlled by the stack bus controller 410. Control lines 411 provide control and clock signals from the stack bus controller 410 to the components of the read/write stacks 400-1.

In the preferred arrangement, the stack bus is partitioned into a SABus 422 for communication between the common processor 500 and the stack of sense amplifiers 212, and a DBus 423 for communication between the processor and the stack of data latches 430.

The stack of data latches 430 comprises of data latches 430-1 to 430-k, one for each memory cell associated with the stack The I/O module 440 enables the data latches to exchange data with the external via an I/O bus 231.

The common processor also includes an output 507 for output of a status signal indicating a status of the memory operation, such as an error condition. The status signal is used to drive the gate of an n-transistor 550 that is tied to a FLAG BUS 509 in a Wired-Or configuration. The FLAG BUS is preferably precharged by the control circuitry 110 and will be pulled down when a status signal is asserted by any of the read/write stacks.

Figure 9:
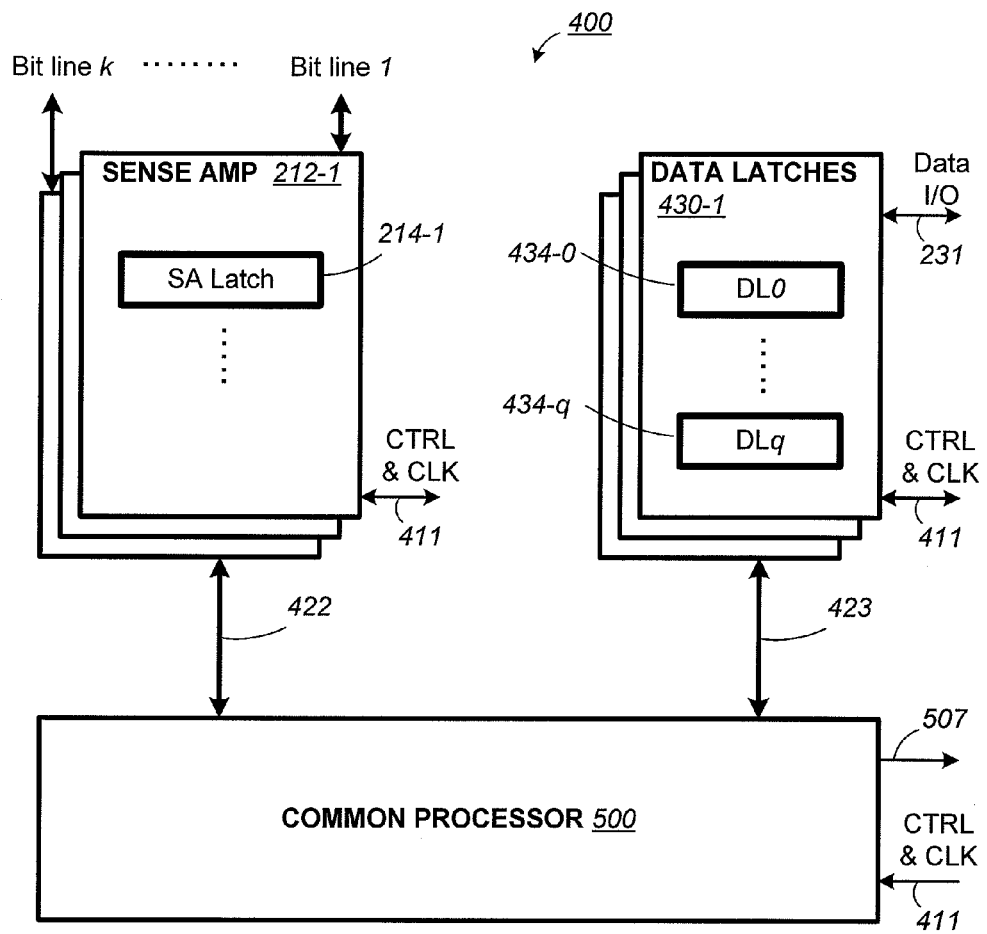
FIG. 9 is a functional block diagram of a read/write stack of FIG. 8.

FIG. 9 is a functional block diagram of a read/write stack of FIG. 8. Essentially, each read/write stack services k memory cells, which is a subset of a page in parallel. The read/write stack contains a stack of sense amplifiers 212-1 to 212-k and a stack of data latches 430-1 to 430-k. The stack of sense amplifiers and the stack of data latches share the common processor 500 which is able to process data among them. At any one time the common processor 500 processes the data related to a given memory cell. For example, for the memory cell coupled to bit line 1, the corresponding sense amplifier 212-1 latches the data sensed from the memory cell into a sense amplifier latch, SA Latch 214-1. Similarly, the corresponding set of data latches 430-1 stores input or output data associated with the memory cell coupled to bit line 1. In the preferred embodiment, the set of data latches 430-1 comprises a set of data latches, 434-0, ..., 434-q or respectively DL0, DL1, ..., DLq for storing (q+1)-bits of information.

The page of memory cells shares a common word line and each memory cell of the page is coupled via bit line to a sense amplifier. When the page of memory cells is read or written, it is also referred to as being read from or written to the word line associated with the page of memory cells. Similarly, the data associated with the page of memory cell is referred to as a page of data.

Such read/write circuits have been described in United States Patent Application Publication US-2006-0140007-A1, published on Jun. 29, 2006, the entire disclosure of which is incorporated herein by reference.

Figure 10:
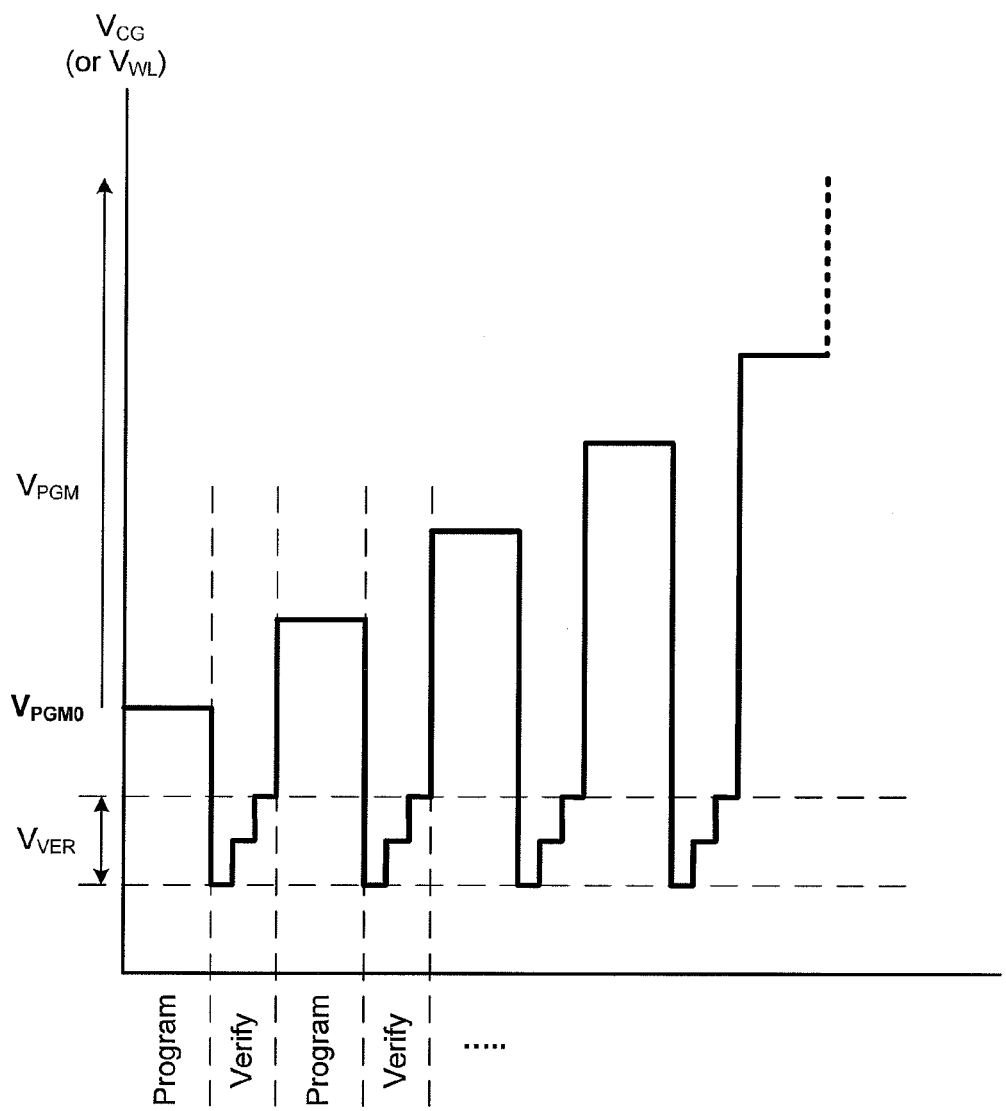
FIG. 10 illustrates a series of programming voltage pulses in the form of a staircase waveform being applied to a selected word line.

FIG. 10 illustrates a series of programming voltage pulses in the form of a staircase waveform being applied to a selected word line. When a cell is programmed to a given state, it is subject to successive programming voltage pulses, each time attempting to add incremental charges to the floating gate. In between programming pulses, the cell is read back or verified to determine its source-drain current relative to a breakpoint level. Programming stops for a cell when it has been verified to reach the desired state. The programming pulse train used may have increasing period or amplitude in order to counteract the accumulating electrons programmed into the charge storage unit of the memory cell. Programming circuits generally apply a series of programming pulses to a selected word line. In this way, a page of memory cells whose control gates are connected to the word line can be programmed together. Whenever a memory cell of the page has been programmed to its target state, it is program-inhibited while the other cells continue to be subject to programming until all cells of the page have been program-verified.

Cell-To-Cell Coupling (the "Yupin Effect")

The charge programmed into the charge storage element of one memory cell produces an electric field that perturbs the electric field of a neighboring memory cell. If a memory cell is program-verified under a first field environment and later is read again under a different field environment due to neighboring cells subsequently being programmed with different charges, the read accuracy may be affected by what is referred to as the "Yupin Effect". With ever higher integration in semiconductor memories, the perturbation of the electric field due to the stored charges between memory cells (Yupin effect) becomes increasing appreciable as the inter-cellular spacing shrinks.

The Yupin effect can be mitigated by minimizing the asymmetry in field environment for a cell between the time of program-verifying and a time of reading subsequent to the neighboring cells have been programmed. This problem affects adjacent cells along a row and across bit lines (BL-BL Yupin effect) and along a column across word lines (WL-WL Yupin effect) of a memory array.

One way to reduce BL-BL Yupin effect is to adopt a multi-bit coding that avoids large change in charges between each pass of binary programming. A preferred coding with such characteristics is given by the "LM" coding.

One way to reduce WL-WL Yupin effect is to program the pages in the memory array in an optimal order.

One way to correct WL-WL Yupin effect is to read the programmed pages using a "look-ahead" or "LA" correction.

Exemplary Preferred "LM" Coding for a 2-bit or 4-state Memory

Figure 11:
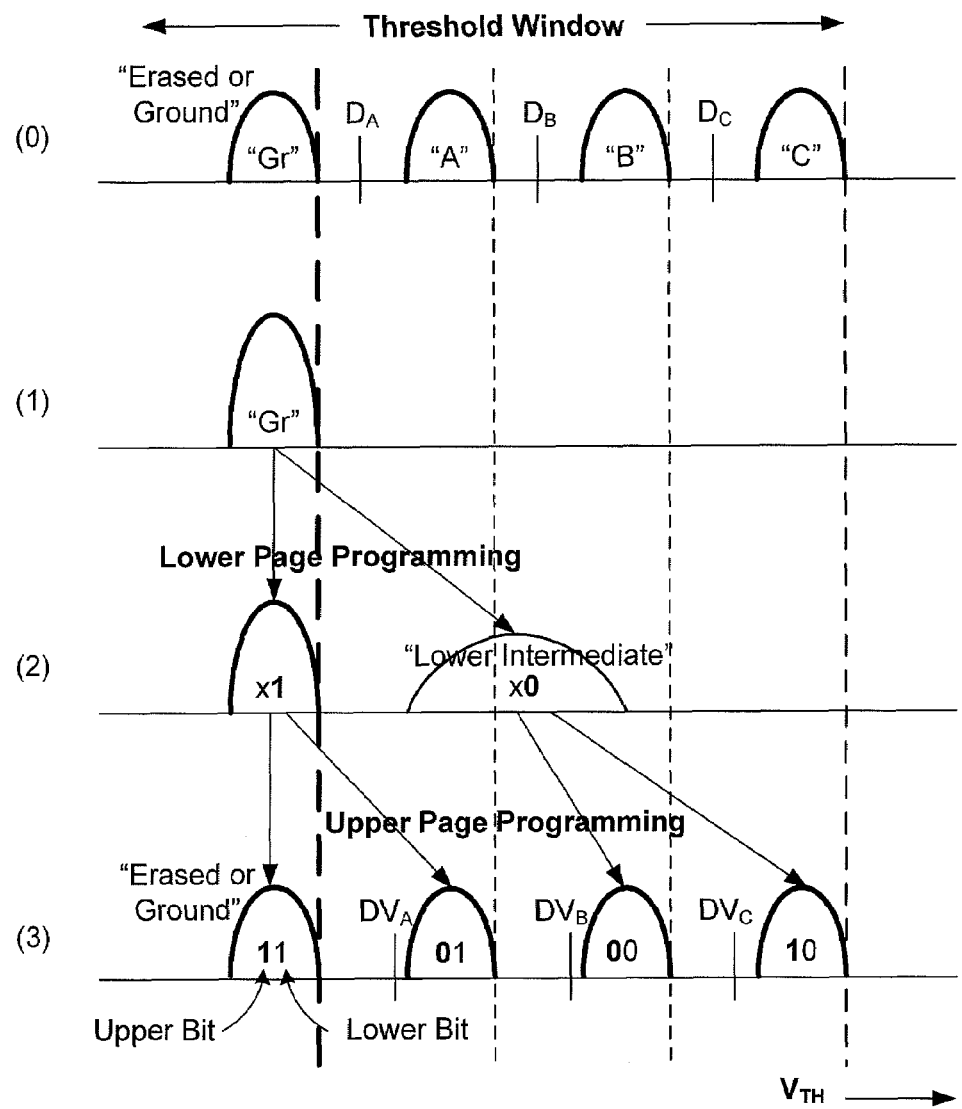
FIGS. 11(0)-11(3) illustrate a logical page by page programming of a 4-state memory encoded with a preferred 2-bit logical code ("LM" code).

FIGS. 11(0)-11(3) illustrate a logical page by page programming of a 4-state memory encoded with a preferred 2-bit logical code ("LM" code). The 2 code bits from each memory cell of a page form two logical pages with each page formed from one code bits contributed from every memory cells of the page. Programming can be performed logical-page by logical page with the lower page followed by the upper page. This code provides fault-tolerance and alleviates the BL-BL the Yupin Effect. FIG. 11(0) illustrates the threshold voltage distributions of a 4-state memory array. The possible threshold voltages of each memory cell spans a threshold window which is partitioned into four regions to demarcate four possible memory states, "Gr", "A", "B" and "C". "Gr" is a ground state, which is an erased state within a tightened distribution and "A", "B" and "C" are three progressively programmed states. During read, the four states are demarcated by three demarcation breakpoints, $D_A$, $D_B$ and $D_C$.

FIG. 11(3) illustrates a preferred, 2-bit LM coding to represent the four possible memory states. Each of the memory states (viz., "Gr", "A", "B" and "C") is represented by a pair of "upper, lower" code bits, namely "11", "01", "00" and "10" respectively. The LM coding differs from the conventional Gray code in that the upper and lower bits are reversed for states "A" and "C". The "LM" code has been disclosed in U.S. Pat. No. 6,657,891 and is advantageous in reducing the field-effect coupling between adjacent floating gates by avoiding program operations that require a large change in charges. As will be seen in FIG. 11(2) and 11(3), each programming operation results in moderate change of the charges in the charge storage unit as evident from the moderate change in the threshold voltages $V_T$.

The coding is designed such that the 2 code bits, "lower" and "upper" bits, may be programmed and read separately. When programming the lower bit, the threshold level of the cell either remains in the "erased" region or is moved to a "lower middle" region of the threshold window. When programming the upper bit, the threshold level of a cell in either of these two regions is further advanced to a slightly higher level in a "lower intermediate" region of the threshold window.

FIGS. 11(1) and 11(2) illustrate the lower page programming using the 2-bit LM code. The fault-tolerant LM code is designed to avoid any subsequent upper page programming to transit through any intermediate states. Thus, the first round, lower page programming has a cell remain in the "erased" or "Gr" state if the lower bit is "1" or programmed to a "lower intermediate" state if the lower bit is "0". Basically, the "Gr" or "ground" state is the "erased" state with a tightened distribution by having the deeply erased states programmed to within a well-defined range of threshold values. The "lower intermediate" states may have a broad distribution of threshold voltages that straddle between memory states "A" and "B". During programming, the "lower intermediate" state is verified relative to a coarse demarcation such as $D_A$.

FIGS. 11(2) and 11(3) illustrate the upper page programming using the 2-bit LM code. The upper page programming is performed on the basis of the first round, lower page programming. A given upper bit can represent different memory states depending on the value of the lower bit. In the second round of programming, if a cell is to have the upper bit as "1" while the lower bit is at "1", i.e. (1,1), there is no programming for that cell and it remains in "Gr". If the upper bit is "0" while the lower bit is at "1", i.e., (0,1), the cell is programmed from the "Gr" state to the "A" state. During programming to "A", the verifying is relative to the demarcation $DV_A$. On the other hand, if the cell is to have the upper bit as "0" while the lower bit is at "0", i.e., (0,0), the cell is programmed from the "lower intermediate" state to "B". The program verifying is relative to a demarcation $DV_B$. Similarly, if the cell is to have the upper bit as "1" while the lower page is at "0", i.e., (1,0), the cell will be programmed from the "lower intermediate" state to "C". The program verifying is relative to a demarcation $DV_C$. Since the upper page programming only involves programming to the next adjacent memory state from either the "Gr" state or the "lower intermediate" state, no large amount of charges is altered from one round to another. Also, the lower page programming from "Gr" to a rough "lower intermediate" state is designed to save time. In each programming pass, the increasing programming pulses are restarted and ramped up from an initial Vpgm0 (see FIG. 10.)

In another preferred embodiment, a "Quick Pass Write" programming technique is implemented. Whenever programming of a cell approaches close to a verification demarcation point, the programming will be switched to a slower (i.e. finer) mode by suitable biasing of the bit line voltage or by modifying the programming pulses. In this way, larger programming steps can be used initially for rapid convergence without the danger of overshooting the target state. "QPW" programming algorithm has been disclosed in U.S. patent application Ser. No. 11/323,596, filed Dec. 29, 2005 and entitled, "Methods for Improved Program-Verify Operations in Non-Volatile Memories," the entire disclosure of which is hereby incorporated herein by reference.

Figure 12:
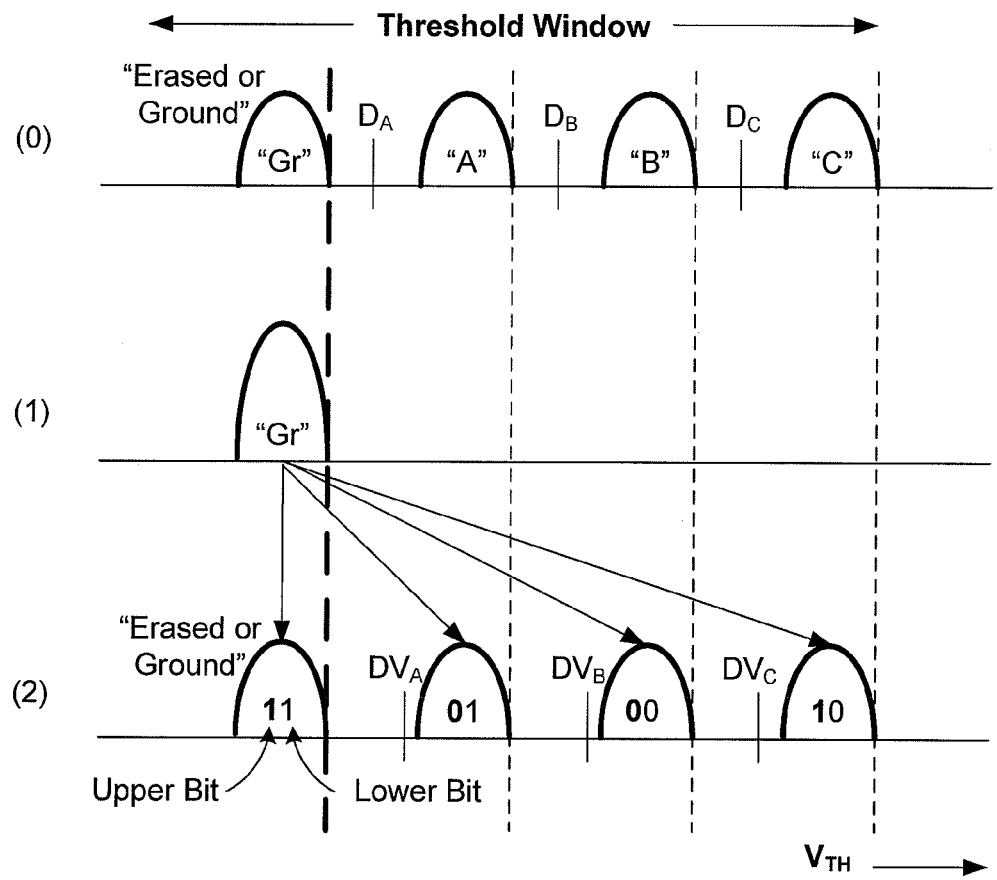
FIGS. 12(0)-12(2) illustrate a full-sequence programming of a 4-state memory encoded with a preferred 2-bit logical code ("LM" code).

FIGS. 12(0)-12(2) illustrate a fall-sequence programming of a 4-state memory encoded with a preferred 2-bit logical code ("LM" code). Similar to FIG. 11(0), FIG. 12(0) illustrates the threshold voltage distributions of a 4-state memory array with an erased state as a ground state "Gr" and progressively more programmed memory states "A", "B" and "C". FIGS. 12(1)-12(2) illustrate a full-sequence programming scheme in which all 2 bits are available to discern the target state which is then programmed directly from the "Gr" state. The programming pulses will be increasing monotonically from Vpgm0 in one programming pass with verifying using the threshold reference $DV_A$ for programming "11" to "A" state, followed by $DV_B$ for programming "01" to "B" state and finally $DV_C$ for programming "10" to "C" state. Once a memory cell is program-verified, it is program-inhibited. Programming for the page is finished when the last cell is program-verified.

Figure 13A:
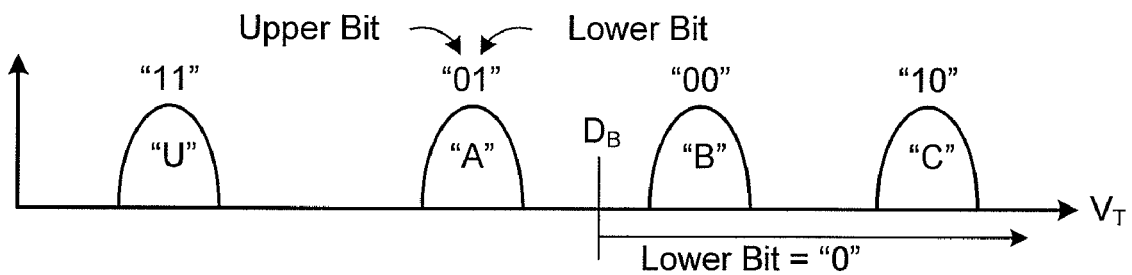
FIG. 13A illustrates the read operation that is required to discern the lower bit of the 4-state memory encoded with the 2-bit LM code.

FIG. 13A illustrates the read operation that is required to discern the lower bit of the 4-state memory encoded with the 2-bit LM code. The decoding will depend on whether the upper page has been programmed or not. If the upper page has been programmed, reading the lower page will require one read pass of readB relative to the demarcation threshold voltage $D_B$. On the other hand, if the upper page has not yet been programmed, the lower page would be programmed to the "intermediate" state (see FIG. 11(2)), and readB would cause error. Rather, reading the lower page will require one read pass of readA relative to the demarcation threshold voltage $D_A$. In order to distinguish the two cases, a flag ("LM" flag) is written in the upper page (usually in an overhead or system area) when the upper page is being programmed. During a read, it will first assume that the upper page has been programmed and therefore a readB operation will be performed. If the LM flag is read, then the assumption is correct and the read operation is done. On the other hand, if the first read did not yield a flag, it will indicate that the upper page has not been programmed and therefore the lower page would have to be read by a readA operation.

Figure 13B:
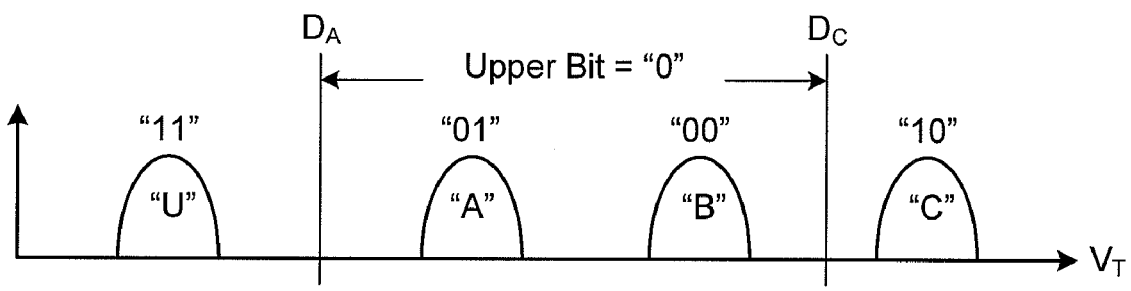
FIG. 13B illustrates the read operation that is required to discern the upper bit of the 4-state memory encoded with the 2-bit LM code.

FIG. 13B illustrates the read operation that is required to discern the upper bit of the 4-state memory encoded with the 2-bit LM code. As is clear from the figure, the upper page read will require a 2-pass read of readA and readC, respectively relative to the demarcation threshold voltages $D_A$ and $D_C$. Similarly, the decoding of upper page can also be confused by the "intermediate" state if the upper page is not yet programmed. Once again the LM flag will indicate whether the upper page has been programmed or not. If the upper page is not programmed, the read data will be reset to "1" indicating the upper page data is not programmed.

If the read is to scan through all sequence of the demarcated states as in a "fall-sequence" read or "all-bit" read, the read is performed relative to the memory states "Gr", "A", "B" and "C" demarcated respectively by reference threshold voltages $D_A$, $D_B$ and $D_C$. As all possible states are differentiated by the full-sequence read, there is no need to check for any LM flag. In this mode of read, all bits are determined together.

Exemplary Preferred "LM" Coding for a 3-bit or 8-state Memory

The example for the 2-bit LM code can be similarly extended to 3-bit or high number of bits.

Figure 14:
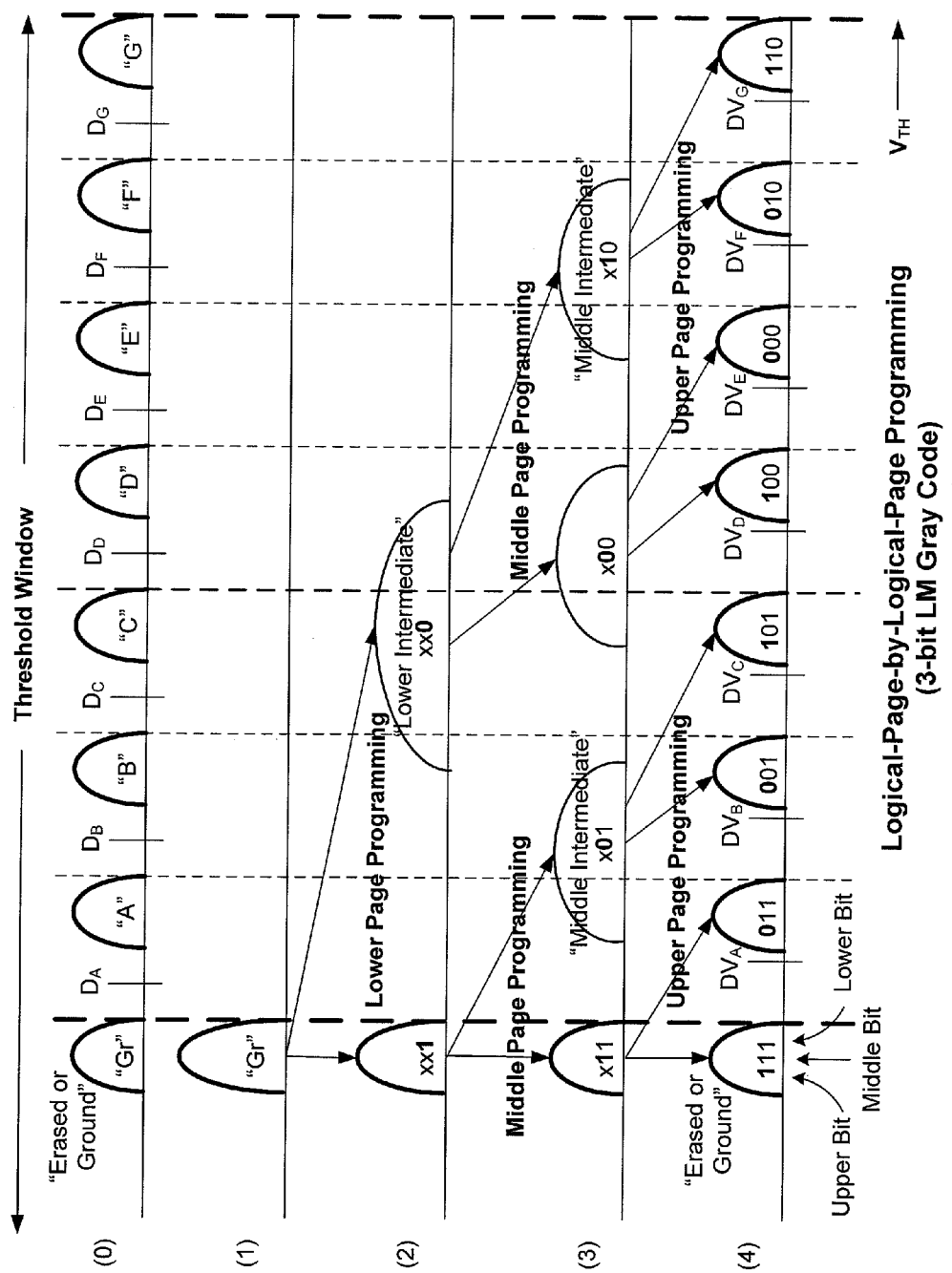
FIGS. 14(0)-14(4) illustrate the programming of an 8-state memory encoded with a preferred 3-bit logical code ("LM" code).

FIGS. 14(0)-14(4) illustrate the programming of an 8-state memory encoded with a preferred 3-bit logical code ("LM" code). The 3 bits from each memory cell of a page forms three logical pages and programming can be performed logical-page by logical page. This code is similar to the 2-bit LM coding described earlier and is an extension into 3 bits to encode eight possible memory states. FIG. 14(0) illustrates the threshold voltage distributions of an 8-state memory array. The possible threshold voltages of each memory cell spans a threshold window which is partitioned into eight regions to demarcate eight possible memory states, "Gr", "A", "B", "C", "D", "E", "F" and "G". "Gr" is a ground state, which is an erased state within a tightened distribution and "A"-"G" are seven progressively programmed states. During read, the eight states are demarcated by seven demarcation breakpoints, $D_A$-$D_G$.

FIG. 14(4) illustrates a preferred, 3-bit LM coding to represent the eight possible memory states. Each of the eight memory states is represented by a triplet of "upper, middle, lower" bits, namely "111", "011", "001", "101", "100", "000", "010" and "110" respectively. As will be seen in FIG. 14(1) and 14(4), each programming operation results in moderate change in the charges in the charge storage unit as evident from the moderate change in the threshold voltages $V_T$.

The coding is designed such that the 3 code bits, "lower", "middle" and "upper" bits, may be programmed and read separately. Thus, the first round, lower page programming has a cell remain in the "erased" or "Gr" state if the lower bit is "1" or programmed to a "lower intermediate" state if the lower bit is "0". Basically, the "Gr" or "ground" state is the "erased" state with a tightened distribution by having the deeply erased states programmed to within a narrow range of threshold values. The "lower intermediate" states may have a broad distribution of threshold voltages that straddling between memory states "B" and "D". During programming, the "lower intermediate" state can be verified relative to a coarse breakpoint threshold level such as $D_B$. When programming the middle bit, the threshold level of a cell will start from one of the two regions resulted from the lower page programming and move to one of four possible regions. When programming the upper bit, the threshold level of a cell will start from one of the four possible regions resulted from the middle page programming and move to one of eight possible memory states.

In general a page of memory cells is being programmed in parallel, with each memory cell having 3 bits. Thus, the page of memory cells may be regarded as having 3 logical data pages with each logical data page contributed from one code bit of every cells of the page. Thus, a "lower bit" page is formed from the lower bit of every memory cells of the page, a "middle bit" page is formed from the middle bit of every cell and an "upper bit" page is formed from the upper bit of every cell of the page.

FIGS. 14(1) and 14(2) illustrate the lower page programming using the 3-bit LM code. The fault-tolerant LM code is designed to avoid any subsequent higher page programming to transit through any intermediate states. Thus, the first round, lower page programming has a cell remain in the "erased" or "Gr" state if the lower bit is "1", i.e. (x,x,1) or programmed to a "lower intermediate" state if the lower bit is "0", i.e., (x,x,0). Basically, the "Gr" or "ground" state is the "erased" state with a tightened distribution by having the deeply erased states programmed to within a well-defined range of threshold values. The "lower intermediate" states may have a broad distribution of threshold voltages that straddling between memory states "B" and "D". During programming, the "lower intermediate" state is verified relative to a demarcation such as $D_B$.

FIGS. 14(2) and 14(3) illustrate the middle page programming using the 3-bit LM code. The middle page programming is performed on the basis of the first round, lower page programming. A given middle bit can represent different memory states depending on the lower bit. In the second round of programming, if a cell is to have the middle bit as "1" while the lower bit is at "1", i.e. (x,1,1), there is no programming for that cell and it remains in "Gr". If the middle bit is "0" while the lower bit is at "1", i.e., (x,0,1), the cell is programmed from the "Gr" state to a first "middle intermediate" state straddling between "A" and "B". During programming to the first "middle intermediate" state, the verifying is relative to the demarcation $DV_A$. On the other hand, if the cell is to have the middle bit as "0" while the lower bit is at "0", i.e., (x,0,0), the cell is programmed from the "lower intermediate" state to a second middle "intermediate" state straddling between "C" and "D". The program verifying is relative to a demarcation $DV_C$. Similarly, if the cell is to have the middle bit as "1" while the lower page is at "0", i.e., (x,1,0), the cell will be programmed from the "lower intermediate" state to a third "middle intermediate" state straddling between "E" and "F". The program verifying is relative to a demarcation $DV_E$.

FIGS. 14(3) and 14(4) illustrate the upper page programming using the 3-bit LM code. The upper page programming is performed on the basis of the first and second rounds, namely the lower and middle page programming. A given upper bit can represent different memory states depending on the lower and middle bits. In the third round of programming, if a cell is to have the upper bit as "1" while the lower and middle bits are at "1", i.e. (1,1,1), there is no programming for that cell and it remains in "Gr". On the other hand, if the upper bit is "0" while the lower and middle bits are at "1", i.e. (0,1,1), the cell is programmed from the "Gr" state to the "A" state. During programming to "A", the verifying is relative to the demarcation $DV_A$.

Similarly, if the cell is to have the upper bit as "0" while the lower bit and middle bits are at "0" and "1" respectively, i.e. (0,0,1), the cell is programmed from the first "middle intermediate" state to "B". The program verifying is relative to a demarcation $DV_B$. If the cell is to have the upper bit as "1" while the lower bit and middle bits are at "0" and "1" respectively, i.e. (1,0,1), the cell is programmed from the first "middle intermediate" state to "C". The program verifying is relative to a demarcation $DV_C$.

Similarly, if the cell is to have the upper bit as "1" while the lower bit and middle bits are at "0" and "0" respectively, i.e. (1,0,0), the cell is programmed from the second "middle intermediate" state to "D". The program verifying is relative to a demarcation $DV_D$. If the cell is to have the upper bit as "0" while the lower bit and middle bits are at "0" and "0" respectively, i.e. (0,0,0), the cell is programmed from the second "middle intermediate" state to "E". The program verifying is relative to a demarcation $DV_E$.

Similarly, if the cell is to have the upper bit as "0" while the lower bit and middle bits are at "1" and "0" respectively, i.e. (0,1,0), the cell is programmed from the third "middle intermediate" state to "F". The program verifying is relative to a demarcation $DV_F$. If the cell is to have the upper bit as "1" while the lower bit and middle bits are at "0" and "0" respectively, i.e. (1,1,0), the cell is programmed from the third "middle intermediate" state to "G". The program verifying is relative to a demarcation $DV_G$.

Since the upper page programming only involves programming to the next adjacent memory state from either the "Gr" state or one of the "middle intermediate" states, no large amount of charges is altered from one round to another. This helps to alleviates BL-BL Yupin effect.

As for 4-bit, 5-bit and higher bit LM coding, the same principle applies where an n-bit code would have n data pages with each page formed from every cell in a page contributing a given bit of the code. More importantly, programming from a lower to a higher bit page incurs moderate change in the charge of the cells, thereby limiting the amount of perturbation due to the Yupin effect among a page of memory cells.

Yupin Effect Between Word Lines

As for WL-WL Yupin effect where the perturbations are between memory cells on adjacent word lines, it can be mitigated during programming using a preferred programming scheme. This will effectively reduce the perturbation by half. The remaining half can also be corrected during read by using a preferred "Look-Ahead" reading scheme.

A preferred programming scheme would have the pages associated with the word lines programmed in an optimal sequence. For example, in the case of binary memory where every physical page holds a page of binary data, the pages are preferably programmed sequentially along a consistent direction, such as from bottom to top. In this way, when a particular page is being programmed, the pages on the lower side of it are already programmed. Whatever perturbative effects they may have on the current page, they are being accounted for as the current page is being program-verified in view of these perturbations. Essentially, the sequence of the programming the page should allow the current page being programmed to see a minimum of changes around its environment after it has been programmed. Thus, each programmed page is only perturbed by the pages on the upper side of it and the WL-WL Yupin effect is effectively reduced in half by this programming sequence.

In the case of a memory where each physical page of memory cells is multi-state and the resulting multiple logical data pages are programmed in different passes, the sequence is less straight forward. For example in a 2-bit memory, each physical page associated with a word line can be regarded as a single page of 2-bit data from each cell or two separate logical pages, lower and upper-bit of 1-bit data each from each cell. The physical page can therefore be programmed in one pass with the two bits or in two separate passes, first with the low-bit page and then later with the upper-bit page. When each physical page is to be programmed in two separate passes a modified optimal sequence is possible.

Figure 15:
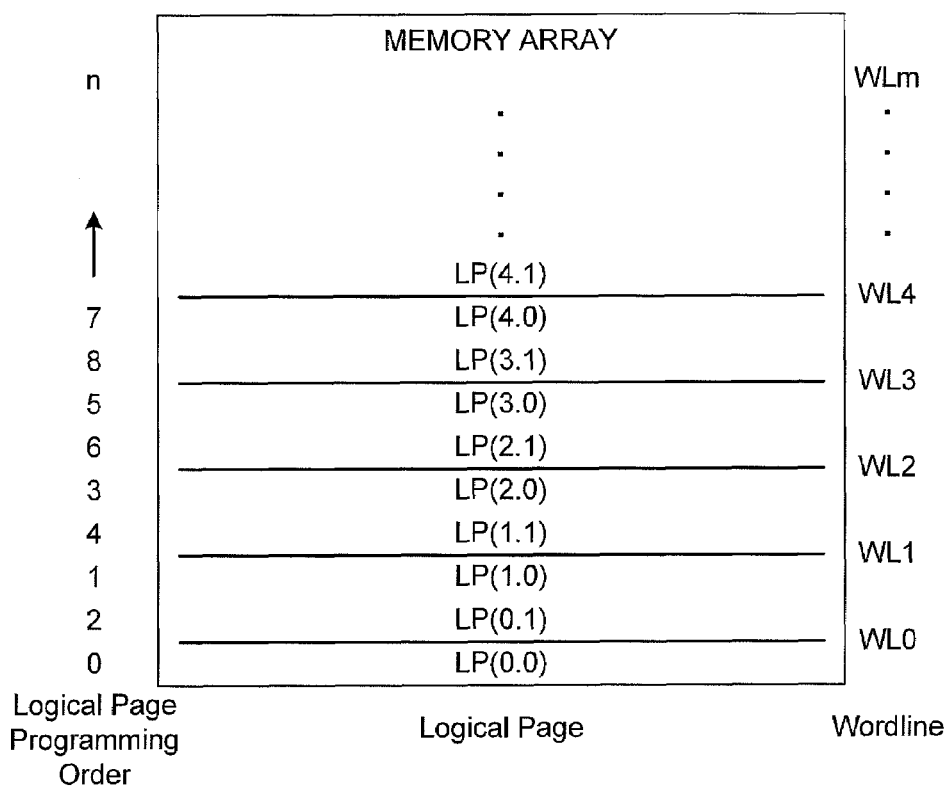
FIG. 15 illustrates an example of a memory having 2-bit memory cells and with its pages programmed in an optimal sequence so as to minimize the Yupin Effect between memory cells on adjacent wordlines.

FIG. 15 illustrates an example of a memory having 2-bit memory cells and with its pages programmed in an optimal sequence so as to minimize the Yupin Effect between memory cells on adjacent word lines. For convenience the notation is such that the physical pages P0, P1, P2, . . . reside respectively on word lines W0, W1, W2, . . . For a 2-bit memory, each physical page has two logical pages associated with it, namely lower-bit and upper-bit logical pages, each with binary data. In general a particular logical page is given by LP(Wordline.logical_page). For example, the lower-bit and upper-bit pages of P0 on W0 would respectively be labeled as LP(0.0) and LP(0.1), and the corresponding ones on W2 would be LP(2.0) and LP(2.1).

Essentially, the programming of the logical pages will follow a sequence n so that the current page being programmed will see a minimum of changes around its environment after it has been programmed. In this case, again moving incrementally in one consistent direction from bottom to top will help to eliminate perturbation from one side. Furthermore, because each physical page may have two programming passes, as the programming moves up the physical pages, it will be better for the current upper-bit page to be programmed after its adjacent lower-bit pages have already been programmed so that their perturbative effects will be accounted for when programming the current upper-bit page. Thus, if programming starts from LP(0.0) then the sequence will be as earmarked by the page-programming order, 0, 1, 2, . . . n, . . . which would yield: LP(0.0), LP(1.0), LP(0.1), LP(2.0), LP(1.1), LP(3.0), LP(2.1), . . .

Correction for WL-WL Yupin Effect During Read (Lookahead or "LA" Read)

The LA reading scheme has been disclosed in United States Patent Application Publication No. US-2006-0221714-A1 published on October, 2006, entitled, "Read Operations for Non-Volatile Storage that Includes Compensation for Coupling," which entire disclosure is herein incorporated by reference. Read with the LA ("Look Ahead") correction basically examines the memory states programmed into the cells on an adjacent wordline and corrects any perturbation effect they have on the memory cells being read on the current wordline. If the pages have been programming according to the preferred programming scheme described above, then the adjacent wordline will be from the wordline immediately above the current one. The LA correction scheme would require the data on the adjacent wordline to be read prior to the current page.

For example, referring to FIG. 15, if the current page (m) to be read is on WLm (e.g., WL1), then the LA read will read the next wordline WLm+1 (e.g., WL2) first and save the data result in one data latch. Next, the current page will then be sensed in view of the WLm+1 result.

As described earlier in connection with FIG. 15, in the 2-bit LM code with the preferred programming sequence, the lower page (e.g., LP(1.0) will be programmed to $D_B$ or close to $D_B$ (intermediate state). The upper page (e.g., LP(1.1)) will be programmed only after the WLm+1 lower page (e.g., LP(2.0)) is programmed. Then the lower page WL-WL Yupin effect will be eliminated completely. Therefore, the data dependent correction will only be performed on the "A" and "C" states, and not on the "Gr" or the "B" state. If the programming does not follow such an optimized order, the data dependent correction will be performed on all four states.

In a preferred implementation of the LA read, a latch is used to indicate whether the LA read found the "A" or "C" state or the "Gr" or "B" state. In the former case, correction is needed and in the latter case, correction is not needed. The corresponding cell in the current read $S_1(n)$ will be corrected accordingly by suitable adjustment of the sensing parameters, such as raising the word line voltage during sensing. This is done for the entire current page by sensing once with adjustment and another time without adjustment. The data for each cell of the page will then be selected from these two sensing according to whether the latch indicates correction or not.

Reading logical page by logical page with LM code will need to check the LM flag (see description in connection with FIGS. 13A and 13B) before the read result is finalized (either by a second pass read or by resetting the read data.) LA correction needs to do the next word line read first before reading the current word line. Therefore both the LM flag from the next word line read and the LM flag from the current world line need to be checked by the state machine. These two LM flags need to be output via the I/O bus to the state machine when the I/O bus is not busying toggling read data. In the case of an "all-bit" or "full sequence" read, there is no need to check for the LM flag.

Copy Data From One Word Line to Another

Figure 16:
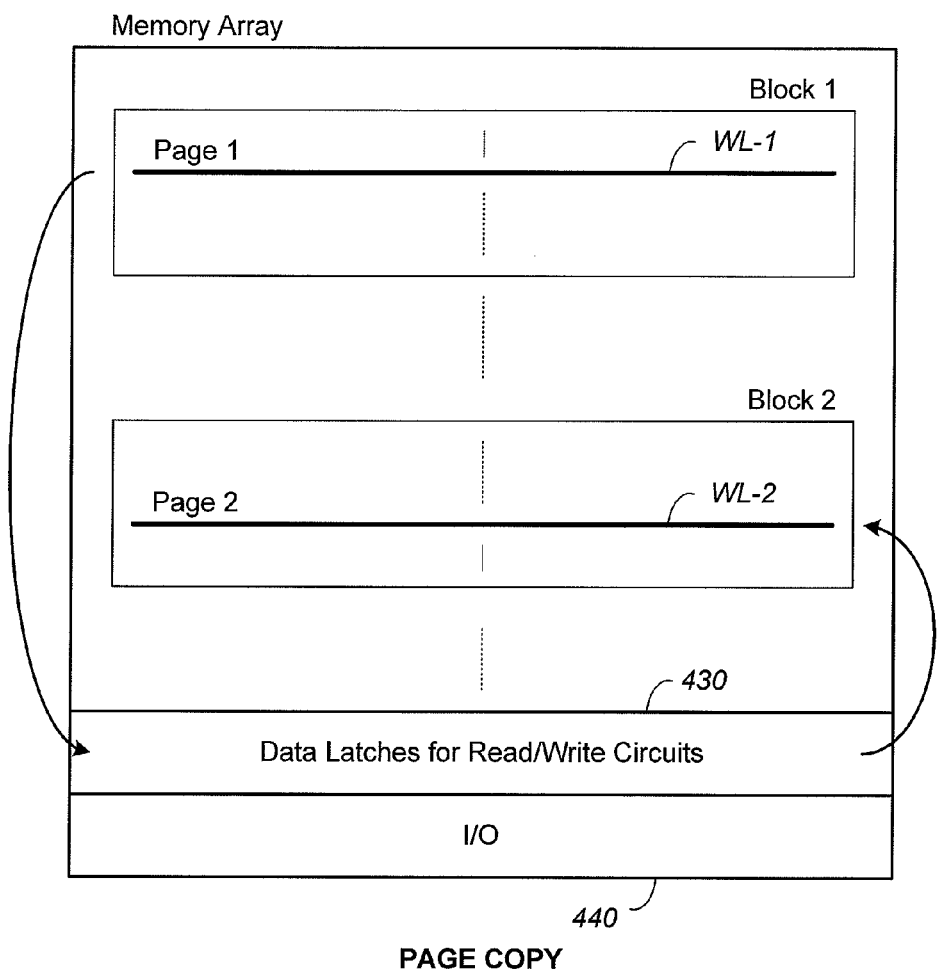
FIG. 16 illustrates a page copy operation in which data of a page of memory cells in a first location is copied to that in a second location in the memory array.

FIG. 16 illustrates a page copy operation in which data of a page of memory cells in a first location is copied to that in a second location in the memory array. Typically, the first location is from a first page (page 1) of memory cells sharing a first word line WL-1 in one erase block (e.g., Block 1) and the second location is from a second page (page 2) at a second word line WL-2 in another erase block (Block 2). Both page of memory cells share a common set of bit lines and therefore the same set of read/write circuits (see FIG. 6 and FIG. 7). This situation arises during a consolidation or a garbage collection operation where a first erase block contains a mixture of valid data and obsolete data. The valid data is salvaged by being copied to a second erase block before the first erase block is erased and recycled.

FIG. 16 illustrates a conventional, simple implementation of page copy that does not require data to leave the memory chip. It has the data from page 1 at a word line WL-1 sensed by the sense amplifiers and latched into the data latches 430 (see FIG. 9). The latched data then serves as program data and is programmed back to page 2 at WL-2. The latched data need not leave the memory chip via the I/O 440.

Figure 17:
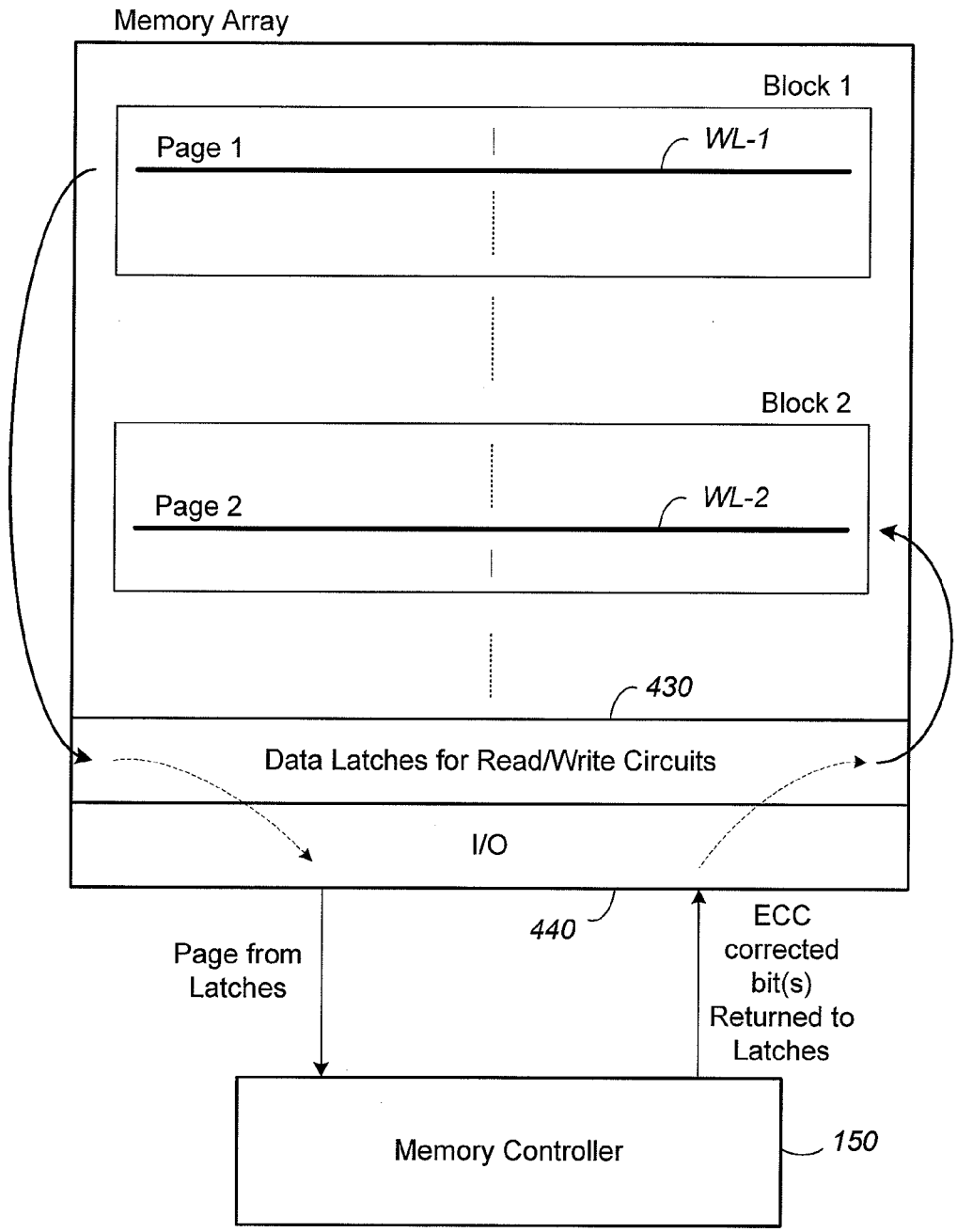
FIG. 17 illustrates a preferred page copy operation in which read data is corrected for any errors by an external controller before being copied to a destination location in memory.

FIG. 17 illustrates a preferred page copy operation in which read data is corrected for any errors by an external controller before being copied to a destination location in memory. The arrangement is similar to that shown in FIG. 14 except after the read data is latched in the data latches 430, it is transferred out of the I/O 440 to an external memory controller 150 to have the data checked and corrected for errors. When data is copied from one location to another, the data is often toggled out to be checked (for error, for example), or updated (such as updating a header), or both (such correcting detected error) or data-processed for some other purposes such as encryption and decryption or compression.

Typically, an ECC (error correction code) is computed for a page of data and stored along with the page of data. When the page of data is read, it is checked against its associated ECC and up to a predetermined number of bit errors is correctable by the ECC. Usually, the memory chip 100 (see FIG. 1) containing the memory array and the peripheral circuits does not have enough computing power to evaluate and correct ECC errors. The ECC processing is performed by the external memory controller 150. For that reason, the read data needs to be transferred out of the memory chip to the memory controller for ECC processing. The corrected data if any is returned from the memory controller back to the data latches. After the data in the data latches has been ECC-processed, it is ready for programming the page back to the destination location.

Cached Page Copy

It takes time to shuttle data between the data latches and the external memory controller. As described earlier, with an erase block containing a large number of pages, it will need to be recycled as it fills up. The latest version of data is copied to a new block before the block is erased and recycled. With each newer generation of memory device, the block copy time can become longer as the block size and page size are increasing and each memory cell may store more bits. Furthermore the read may involve many more passes as it may include reading an adjacent word line ("WL") to correct for WL-WL Yupin effect.

Generally, to improve the block copy performance, the operation can be shortened by hiding at least some of the data shuttling time inside the program time. Cache page copy is implemented such that the two time-consuming operations, data I/O and programming, can take place at the same time. While the read and program operations interleave as they both involve memory core operations, the data latch I/O and program operations can take place simultaneously. Thus, a current page of read data can be toggle out and modified while a previous page is being programmed.

In conventional read operations, only one data latch is needed for single logical page read. So for each cell, one latch is used to store the single bit from the current read and another latch is used for caching the bit from a previous read. In this way, the bit from the current read can be toggled out and then back to the latch after it has been data processed while programming of the previous bit that has already been data-processed can take place at the same time.

Various aspects of data relocation and caching operations are described in U.S. Patent Application Publication Numbers US-2006-0233026-A1 published on Oct. 19, 2006; US-2006-0221704-A1 published on Oct. 5, 2006; US-2005-0257120-A1 published on Nov. 17, 2005; US-2006-0136687-A1 published on Jun. 22, 2006; and U.S. Pat. No. 6,266,273, which are all hereby incorporated by reference.

In order to compensate for WL-WL floating gate coupling effect, the LA read (look-ahead) read is implemented to correct the read on a WLm based on the perturbation due to the states programmed in an adjacent WLm+1. The compensated read involves the current WLm to be sensed multiple times relative to each instance of the four memory states occurring in WLm+1 in order to compensate for its perturbation effect. Thus, latches must be provided to store the read data from the adjacent WLm+1 before the current WLm can be read and compensated accordingly. For 2-bit memory system ("D2"), 2 additional data latches will be needed for the WLm+1 read. For 3-bit memory system ("D3"), 3 additional data latches will be needed for the WLm+1 read.

While it is possible to build memory device with enough latches to store both the WLm+1 and WLm data and also for caching, it is desirable to use a minimum of latches for each memory cell of a page and still be able to implement LA read and cache page copy.

According to a general aspect of the present invention, an efficient utilization of a minimum number of n+1 data latches for each memory cell enables an n-bit memory to implement read with compensation for data stored in adjacent word line and for efficient data relocation. Thus, a 2-bit memory will only need 3 data latches per memory cell to implement read with compensation for data stored in adjacent word line and for efficient data relocation. Similarly, a 3-bit memory will only need 4 data latches per memory cell to implement read with compensation for data stored in adjacent word line and for efficient data relocation.

For a page memory cells each storing n-bit data to be relocated, this is accomplished by reading the page of n-bit data and latching into a corresponding page of n-bit latches such that n logical pages of single bit data one from each of the n-bit data are latched, shuttling in a predetermined order each of the n logical data pages page-by-page out for data-processing and returning any modified bits back to originating latches while simultaneously programming page-by-page the processed-data as it returns. In this way, at least some of the time for toggling the data out and back can be hidden behind the write operation, thereby improving the performance for page copying.

In particular, the logical data pages are shuttled for data-processing in the predetermined order such that the first data page available for programming will allow programming to start from the erased state up to a given programmed state even when all the bits of the n-bit code are not available to resolve all memory states. Similarly, an additional available page will allow programming to continue to even higher programmed states. When all the code bits become available, the programming can be completed since the target state of every memory cell of the page is defined.

Figure 18:
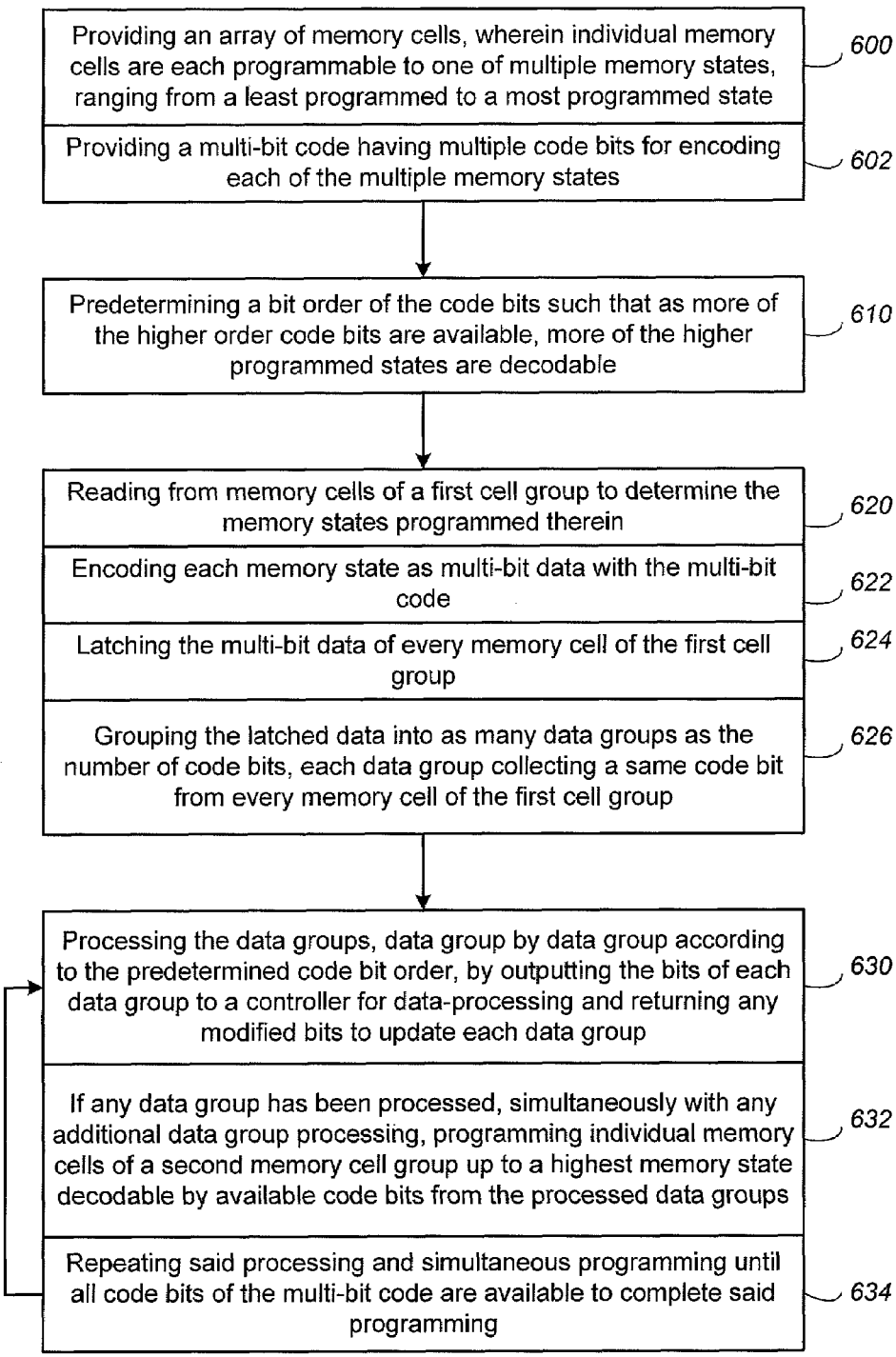
FIG. 18 is a flowchart for a cache copy scheme according to a general embodiment of the invention.

FIG. 18 is a flowchart for a cache page copy scheme according to a general embodiment of the invention. As mentioned earlier, the page copy is typically initiated the memory device as a system operation during block consolidation or garbage collection operations. It may also a host operation requested by a host. In the preferred embodiment, the operations are under the control of the control circuitry 110 driven by the state machine 112 shown in FIG. 1.

STEP 600: Providing an array of memory cells, wherein individual memory cells are each programmable to one of multiple memory states, ranging from a least programmed to a most programmed state.

STEP 602: Providing a multi-bit code having multiple code bits for encoding each of the multiple memory states.

STEP 610: Predetermining a bit order of the code bits such that as more of the higher order code bits are available, more of the higher programmed states are decodable.

STEP 620: Reading from memory cells of a first cell group to determine the memory states therein.

STEP 622: Encoding each memory state as multi-bit data with the multi-bit code.

STEP 624: Latching the multi-bit data of every memory cell of the first cell group.

STEP 626: Grouping the latched data into as many data groups as the number of code bits, each data group collecting a same code bit from every memory cell of the first cell group.

STEP 630: Processing the data groups, data group by data group according to the predetermined bit order, by outputting the bits of each data group to an external host or controller for data-processing and returning any modified bits to update each data group.

STEP 632: If any data group has been processed, simultaneously with any additional data group processing of STEP 630, programming individual memory cells of a second memory cell group up to a highest memory state decodable by available code bits from the processed data groups STEP 634: Repeating STEP 630 and STEP 632 until all code bits of the multi-bit code are available to complete the programming.

Figure 19:
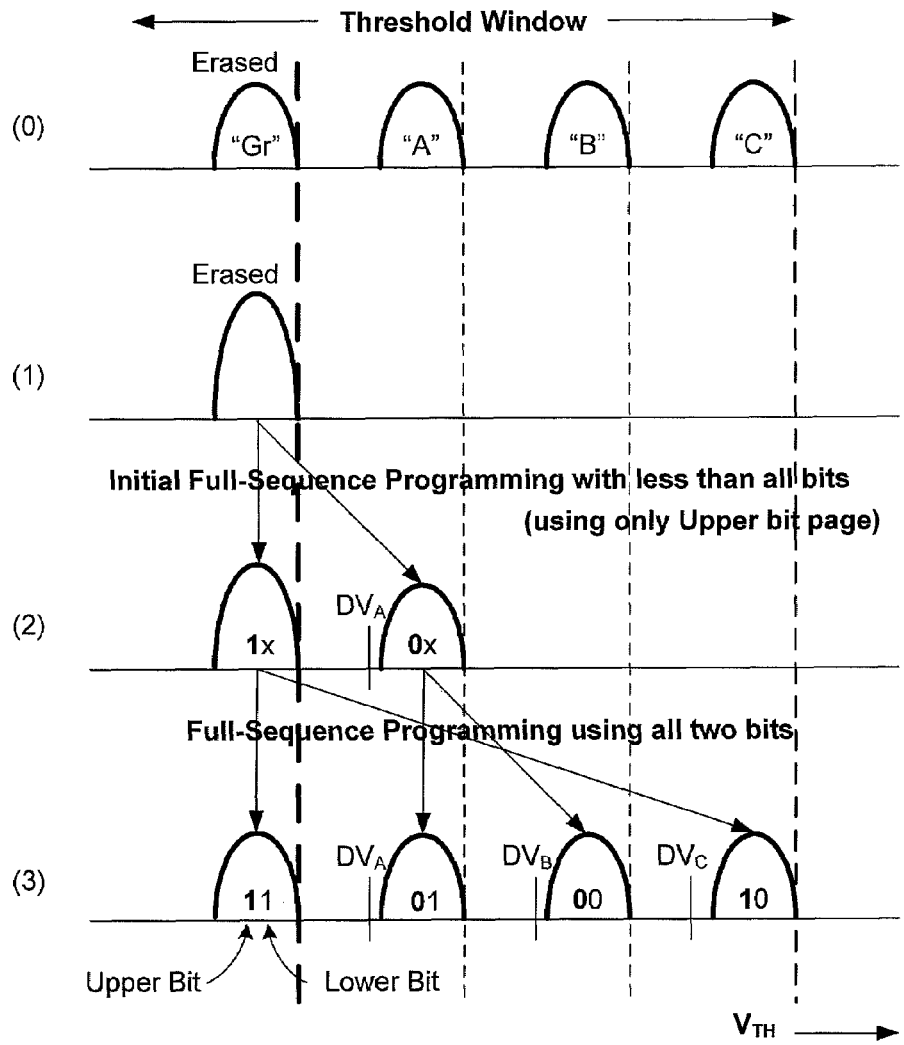
FIG. 19(0)-19(3) illustrate an example of using the 2-bit LM code for the encoding and programming portions of the cache copy scheme shown in FIG. 18.

FIG. 19(0)-19(3) illustrate an example of using the 2-bit LM code for the encoding and programming portions of the cache copy scheme shown in FIG. 18. Similar to FIG. 11(0), FIG. 19(0) illustrates the threshold voltage distributions of a 4-state memory array. In that case, the memory cells in STEP 600 are each programmable to one of four memory states. FIG. 19(3) illustrates the example 2 bit LM coding for each of the four memory states as provided in STEP 602.

As shown in FIG. 19(3), the 2 bit LM code has two code bits: a lower bit and an upper bit. In the case of page cache copy, the copy destination is initially a page of erased memory cells and its initial thresholds distribution is shown in FIG. 19(1).

FIGS. 19(1)-19(3) show an adaptive full-sequence programming for the 2-bit LM code, according to a preferred embodiment of the invention. This programming mode is in contrast to the 2-pass programming of lower and upper page shown in FIGS. 11(1)-11(3) and also different from the full-sequence programming shown in FIGS. 12(1)-12(2).

In the previously described full-sequence programming, all the bits of a multi-bit code are available to resolve all the possible memory states. Programming commences from the least programmed "Gr" state and all programmed states are programmed in parallel. Those memory cells with "A" state as a target state will be prohibited from further programming once their have been programmed to the "A" state while other memory cells with "B" and "C" will be subject to further programming. Eventually, the memory cells with "B" as a target state will also be locked out from further programming. Similarly, this is ultimately followed by the memory cells with "C" as a target state.

In the adaptive full-sequence programming of the preferred embodiment, not all the bits of a multi-bit code are available at once. Typically, one bit is available initially; it is then followed by a next bit and then a next bit until finally all bits of the multi-bit code are in place. Instead of waiting for all the bits to become available before programming can start, the adaptive programming mode allows programming with less than all the bits. This is possible when the first available bit is able to resolve between the first two memory states, namely "Gr" and "A". It can be seen from FIG. 19(2) that the upper bit is able to resolve between the lowest two memory states. When the upper bit is "1", the memory state remains at "Gr" with no programming. For those memory cells with their upper bit at "0", they can be programmed to no more than "A" at this early stage. In this way, even when only one bit of the 2-bit code is available, programming can commence without the danger of over-programming. Eventually, when the second, lower bit becomes available, the 2-bit code will be complete and will be able to resolve all four possible memory states. Programming will then proceed similar to the full sequence mode described in connection with FIGS. 12(1)-12(2).

Thus, for the example 2-bit LM code, STEP 610 of FIG. 18 would have the bit order of the code bits predetermined with the upper bit preceding the lower bit.

In STEP 620, the group of memory cells is read and the memory state in each memory cell of the group is determined.

In STEP 622, using the example 2-bit LM code expressed as "Upper bit Lower bit", the memory state "Gr" will be encoded as "11", "A" as "01", "B" as "00" and "C" as "10".

In one embodiment, the 2-bit data of each memory cell may be sensed in two passes, one as a lower logical page data consisting of lower bits from each memory cell of the page and the other as an upper logical page data as shown in FIGS. 13A and 13B respectively. The lower logical page read pass involves sensing at $D_B$, whereas the upper logical page pass involves two sub-passes, one at $D_A$ and the other at $D_C$. In another embodiment, the 2-bit data may be sensed in "full-sequence" mode where the two bits are sensed together in one pass by sensing relative to the read demarcation threshold values $D_A$, $D_B$ and $D_C$ in three sub-passes respectively.

In STEP 624, the 2-bit data from each memory cells of the group are latched. For example, the data latches 434-1 and 434-2 shown in FIG. 9 can be used to latch the lower and upper bits for each memory cell.

In STEP 626, the latched data are grouped into in two data groups corresponding to the number of code bits in the 2-bit code. The first is a lower-bit data group, collecting all the lower bits from the group of memory cells. Similarly the second is an upper-bit data group, collecting all the upper bits from the group of memory cells.

In STEP 630 bits from each data group are data-processed, a group at a time. The bits from each data group are outputted to a controller for data-processing and any modifications are returned to update the data group. In this case the two data groups are processed according to the predetermined order given in STEP 610, namely the upper-bit data group followed by the lower-bit data group. Thus, the upper-bit data group is first processed by outputting the upper bits to the controller for data processing and returning any modified bits to update the upper-bit data group. This is then followed by the processing of the lower-bit data group.

In STEP 632, during the first iteration of processing the first group of latches in STEP 630, no processed data is available yet for simultaneous programming.

In STEP 634, since not all the code bits of the 2-bit codes are available, the operation returns to STEP 630.

In STEP 630(2), the lower-bit data is processed next. The "(2)" appended to "630" is used to designate a second iteration of the step.

In STEP 632(2), the upper-bit data group has been processed with any update data in place in previous STEP 632. Programming can proceed using the available upper-bit data. Memory cells with "1" 's are not programmed and memory cells with "0" will be programmed up to the next programmed state which is state "A" decodable by using only the upper bit. The programming using the upper-bit data group is taking place simultaneously with the processing of the lower-bit data group in STEP 630(2).

In STEP 634(2), since not all the code bits of the 2-bit codes are available to complete the programming, the operation returns to STEP 630(3).

In STEP 630(3), all upper and lower-bit data groups have been processed, so there is no more group to process.

In STEP 632(3), in addition to the upper bits, the lower bits are now also available. So programming can continue in full-sequence mode using all the code bits ("upper, low"). FIG. 19(3) shows that cells with "11" will remain as "Gr", cells with "10" will be programmed from "Gr" to "C", cells with "01" remaining at "A" and cells with "00" will be programmed from "A" to "B".

In STEP 634(3), the operation ends after all 2 code bits of the 2-bit code are available to complete the programming.

The programming mode described in STEP 630 may be regarded as an "adaptive full-sequence" programming. It is somewhat similar to the "full-sequence" programming described in FIG. 12. The difference is that in the full-sequence case, all the bits (in this case, both lower and upper bits) are used to discern what target state each cell of the page is to be programmed to. Programming is applied to all cells starting from their erased state and as each cell gets programmed reaches its target state, it is inhibited from further programming. On the other hand, in the adaptive full-sequence case, the initial, fuzzy or less than complete bit information is not sufficient to identify the target state of every memory cells of the page but sufficient to distinguish between the ones that should be held back in a given memory state versus the ones that are to be programmed to the next state. As more bits information becomes available, the resolution becomes finer and the programming can proceed to higher and higher memory states. Eventually when all bits become available, the programming becomes a full-sequence programming. Thus, in the adaptive full-sequence programming, the programming of some cells can get a "head start" without waiting for all bits to become available.

Figure 20:
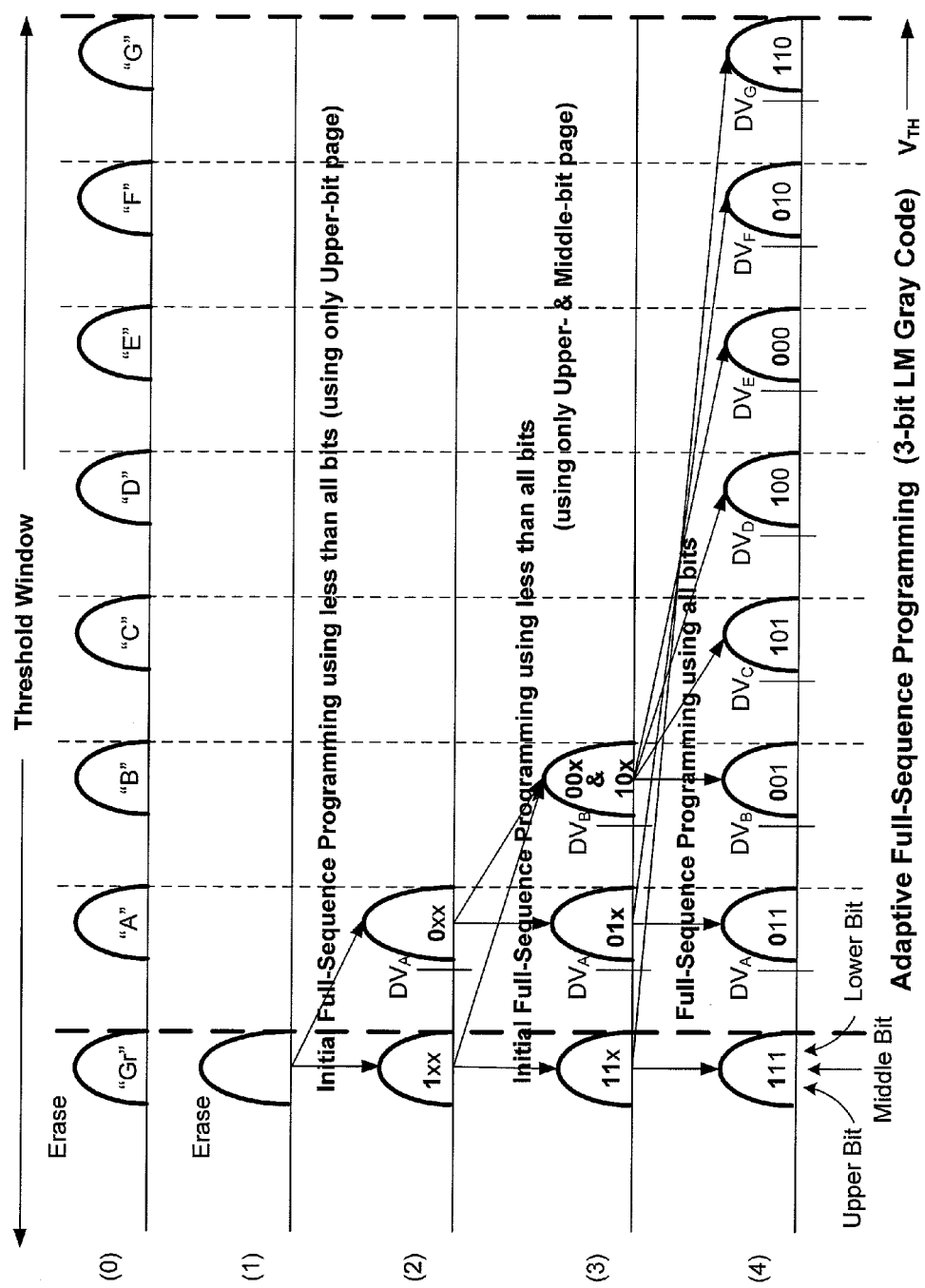
FIGS. 20(0)-20(4) illustrate an example of using a 3-bit LM code for the encoding and programming portions of the cache copy scheme shown in FIG. 18.

FIGS. 20(0)-20(4) illustrate an example of using a 3-bit LM code for the encoding and programming portions of the cache copy scheme shown in FIG. 18. Similar to FIG. 14(0), FIG. 20(0) illustrates the threshold voltage distributions of a 4-state memory array. In that case, the memory cells in STEP 600 are each programmable to one of eight memory states. FIG. 20(4) illustrates the example 3-bit LM coding for each of the eight memory states as provided in STEP 602.

As shown in FIG. 20(4), the 3-bit LM code has three code bits, namely a lower bit, a middle bit and an upper bit. In the case of page cache copy, the copy destination is a page of erased memory cells and their initial thresholds distribution is shown in FIG. 20(1).

FIGS. 19(1)-19(4) show an adaptive full-sequence programming for the 3-bit LM code, according to a preferred embodiment of the invention.

The application of the 3-bit LM code to the cache page copy scheme shown in FIG. 18 is similar to that for the 2-bit LM code described earlier. Essentially, there are eight states encoded by three code bits, namely, "lower, middle, upper" bits.

Similar to FIG. 14(0), FIG. 20(0) illustrates the threshold voltage distributions of an 8-state memory array. In the case of page cache copy, the copy destination is a page of erased memory cells and their initial thresholds distribution is shown in FIG. 20(1).

The 3 code bits of lower, middle and upper bits are ranked according to their ability to resolve from the lowest programmed states. It will be seen from FIG. 20(2) that for the 3-bit LM code, the upper bit is able to distinguish between cells that should be held at the "Gr" state (upper bit=1) or allowed to be programmed to the next programmed states (upper bit=0). Similarly, from FIG. 20(3), the combination of the upper and middle bits is able to distinguish between cells that should be held at "Gr" or at "A" or be allowed to be programmed to "B". Similarly, from FIG. 20(4), the combination of the upper, middle and lower bits which complete the 3-bit code is able to distinguish all possible memory states and programming can proceed in full-sequence mode. Hence, the 3-bit LM code is ordered with the upper bit followed by the middle bit and then the lower bit.

The 3 code bits, upper, middle and lower bits, result in three data groups, one group for each code bit. Similar to the 2-bit case described earlier, the upper-bit data group is processed first. This is then followed by the middle-bit data group. As the middle-bit data group is being process, programming is taking place using the upper-bit data group. Later, as the lower-bit data group is being processed, programming is taking using both the upper- and middle-bit data groups. Finally, after the lower-bit data group has been processed. The programming will be in full-sequence mode using all three code bits of the 3-bit LM code.

The cache page copy scheme described in connection with FIG. 18 improves performance in at least three aspects which are inter-related.

First, programming in the adaptive full-sequence mode allows the programming voltage applied to a word line to be a monotonically increasing function. Programming can be done in one pass from a lowest memory state to a highest memory state across the entire threshold window. This is in contrast to a multi-pass programming where the programming voltage will have to restart back from an initial programming voltage at the beginning of each pass.

Secondly, the adaptive feature allows programming to start even when not all the code bits are available to fully resolve the memory states. Programming can start as soon as even one bit of the multi-bit code is available.

Thirdly, since programming on each memory cell can be done with progressive addition of a bit at a time, the first-bit data group can be used to program the group of memory cells while the second-bit data group are getting ready by being data-processed at the same time. Thus, the data-processing period can be hidden behind the programming time. It will be seen that the inventive cache page copy scheme described in FIG. 18 allows, for an n-bit code, n−1 data-processing operations to be hidden behind programming time. For example, employing a 2-bit code, one data-processing operation period is saved. For a 3-bit code, two data-processing operation periods are saved.

Finally, as will be seen in the following section, even with look-ahead correction for the perturbative effect due to data on a neighboring word line, the inventive cache page copy scheme can be implemented with a minimum of data latches. For an n-bit memory, the number of data latches is n+1 per memory cell.

Cache Page Copy with Correction for Perturbation from Adjacent Word Line (LA Read)

In a preferred embodiment, the page of LM encoded data is read with compensation for perturbation due to an adjacent word line ("WL"). In order to compensate for WL-WL floating gate coupling effect, the look-ahead ("LA") read is implemented to correct the read on a WLm based on the perturbation due to the states programmed in an adjacent WLm+1. LA read techniques has been disclosed in U.S. patent application Ser. No. 11/384,057 filed Mar. 17, 2006, entitled "READ OPERATION FOR NON-VOLATILE STORAGE WITH COMPENSATION FOR COUPLING," by Nima Mokhlesi, incorporated by reference herein in its entirety.

Both the multi-bit coding and "LA" correction would seem to require additional latches and bus activities besides the mere toggling of read data. Nevertheless, the cache page copy scheme described in connection with FIG. 18 is still accomplished with a minimum of n+1 latches for each n-bit memory cell.

Compensating for the effects of floating gate coupling during non-volatile memory read operations requires access to data read from an adjacent word line WLm+1 during the read operation for a selected word line WLm. In essence, the read/write circuits (e.g., 270A, 270B of FIG. 1) needs access to word line WLm+1 data while determining the data values stored in WLm. This can present a challenge for memory designers, particularly when attempting to minimize chip space dedicated to a particular compensation technique. Consider a memory device having memory cells that store two bits of data. If the data from the neighboring word line WLm+1 is to be available during the read operation for the selected word line WLm, a designer may choose to include enough data latches so that the data from word line WLm+1 and word line WLm can be stored simultaneously during a read operation at the selected word line WLm. If each memory cell stores two bits of data, then four data latches for every bit line are necessary. Two data latches can store the two bits of data from word line WLm+1 and another two data latches can store the two bits of data from word line WLm. Similarly, three additional latches could be used for three-bit devices, four additional latches for four-bit devices, etc. While this technique is effective, the addition of data registers at each bit line for the number of bits stored per cell may not be acceptable in some implementations due to space limitations.

A preferred LA reading scheme using a minimum of data latches has been described in U.S. patent application Ser. No. 11/617,544, filed Dec. 28, 2006, entitled, "COMPLETE WORD LINE LOOK AHEAD WITH EFFICIENT DATA LATCH ASSIGNMENT IN NON-VOLATILE MEMORY READ OPERATIONS", by Man Lung Mui and Seungpil Lee, incorporated by reference herein in its entirety.

In the preferred LA reading scheme, only n+1 latches are required to perform a LA read of an n-bit memory cell. Essentially, the perturbing data of WLm+1 is first read. This will occupy n latches per cell for the n-bit WLm+1 read. The additional latch per cell is used to store a flag that indicates whether the data in the n latches of a given cell pertains to WLm+1 or WLm. Then a series of compensated read of WLm is performed.

The compensation can be effected by biasing the word line read voltage as a function of the strength of the perturbation. For example, if the adjacent cell on WLm+1 is at state "Gr", there is no perturbation and the read at WLm will be performed with no bias. If the adjacent cell on WLm+1 is at state "A", there will be bias of a first amount. If the adjacent cell on WLm+1 is at state "B", there will be bias of a second amount and so on.

Alternatively, the compensation can be effected by shifting the demarcation threshold voltage for read a given memory state as a function of the correction needed.

After each compensated read pass, the memory state of the respective memory cells are determined and their data replace the corresponding WLm+1 data in the corresponding latches and the flag is set to indicate WLm data. In general, for an n-bit memory there will be $2^n$ possible memory states on WLm+1 and thus the same number compensation values. When reading WLm, there will be $2^n-1$ demarcation points to distinguish between the four possible memory states. Thus, in general there will be $2^n$ ($2^n-1$) number of LA read passes to complete the compensated read of WLm. For example, the 2-bit memory will have a total of 12 read passes and the 3-bit memory will have a total of 56 read passes. After the LA read is completed, all the WLm+1 data in the latches will be replaced by the WLn data. So the preferred LA read technique requires n+1 latches per memory cell during read and n latches after the read is completed.

Figure 21A:
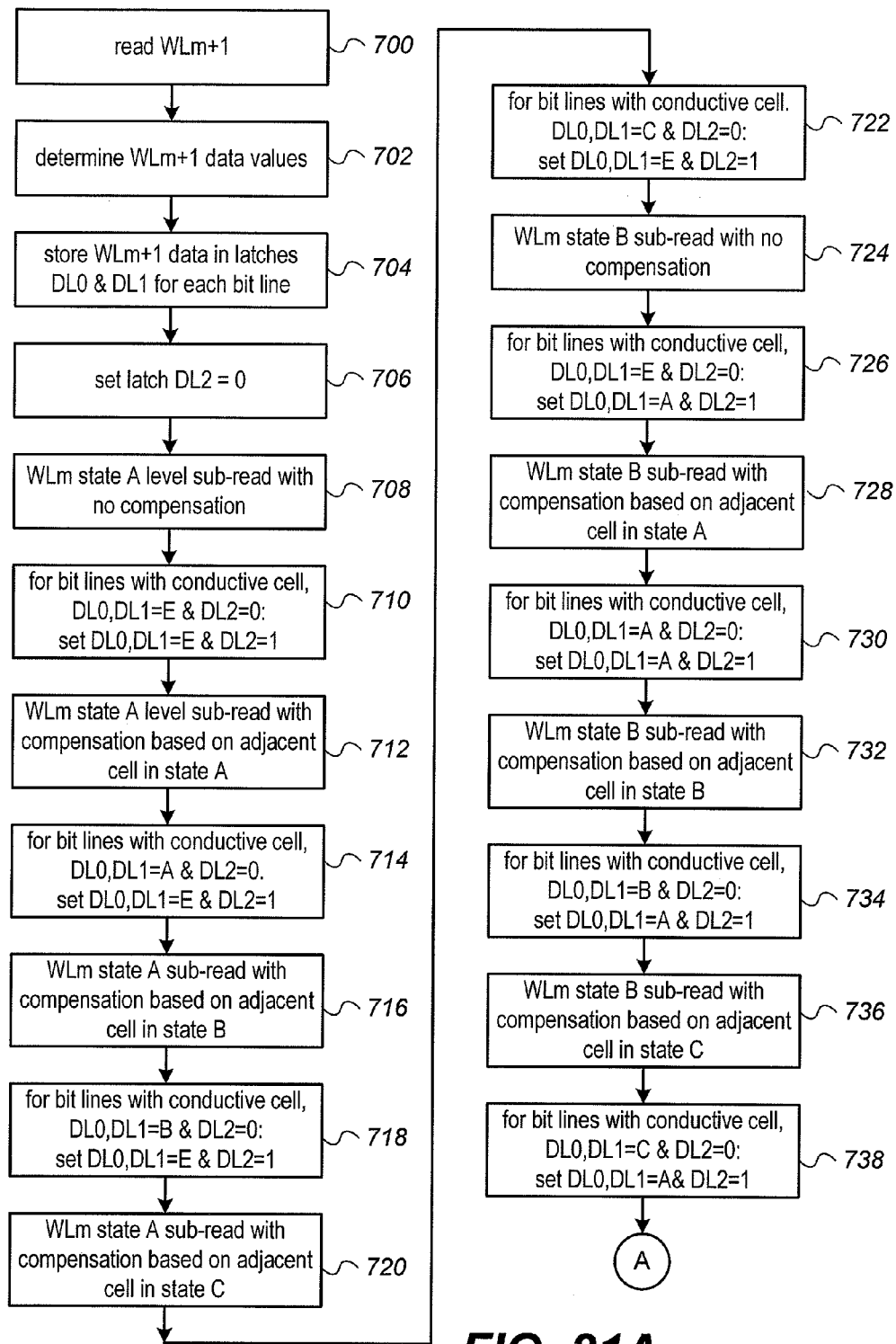
FIGS. 21A-21B show a flowchart describing the preferred method of performing LA read on an example 2-bit memory using 3 data latches.
Figure 21B:
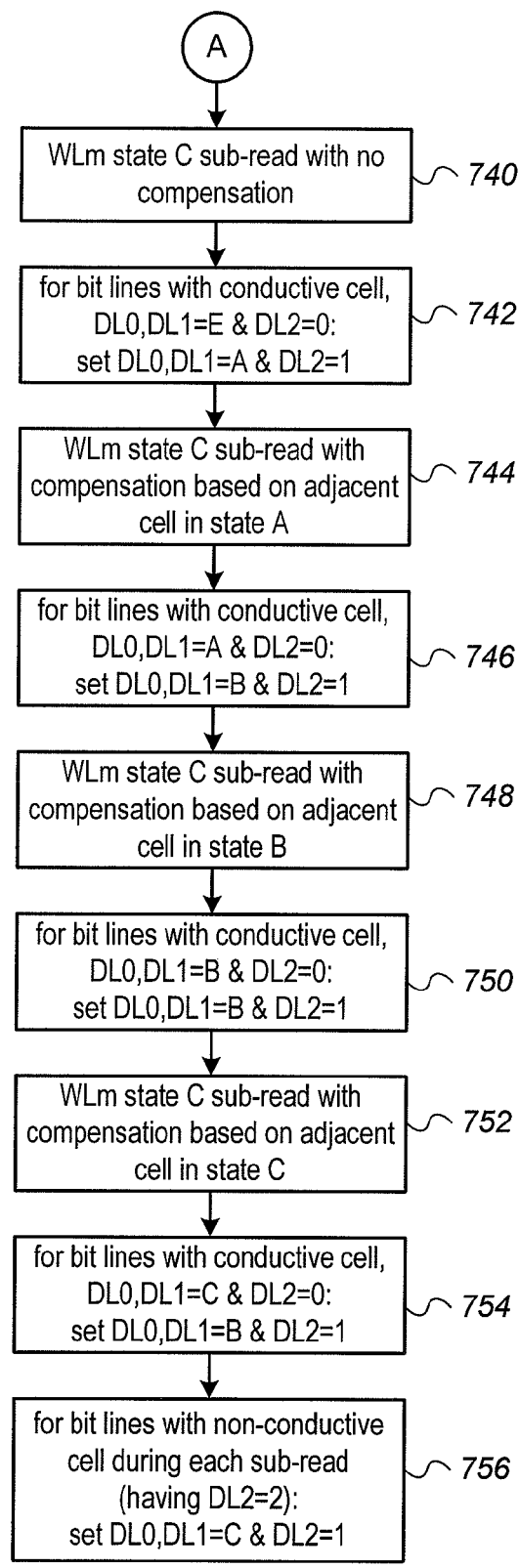

FIGS. 21A-21B show a flowchart describing the preferred method of performing LA read on an example 2-bit memory using 3 data latches. This example is presented for a four-state device storing two bits of data per cell, similar to the example shown in FIG. 11(0). A group of memory cells on word line WLm is read with compensation for coupling effect due to adjacent memory cells on WLm+1. Sensing for each memory cell is performed at the state "A" level (between states "Gr" and "A"), the state "B" level (between states "A" and "B"), and the state "C" level (between states "B" and "C"). Compensations are provided when sensing at each level to account for each of the four potential states of the adjacent memory cells at the subsequently programmed word line WLm+1.

To select the results of the appropriate sense operation for each memory cell, information about the adjacent memory cell on word line WLm+1 is stored for each bit line while sensing the corresponding cell at WLm. The processor for the bit line will use the information to select the results of the appropriate sense operation. For example, in the 2-bit case, the set of data latches, DL0 and DL1 for each bit line is responsible for storing data read from a memory cell of the selected word line. The same set of data latches for each bit line will also store information about a memory cell of the word line adjacent to the selected word line. An additional data latch, DL2, for each bit line operates as a flag, storing an indication as to whether the data latches are storing data for the selected word line or the adjacent word line.

Thus, the technique in FIGS. 21A-21B makes efficient use of the data latches for each bit line such that an extra set of latches is not necessary for storing the data from the adjacent word line WLm+1. In the example of FIGS. 21A-21B, the memory cells store two bits of data, so three data latches are used. It will be understood that the disclosed principles are extendable to implementations with different numbers of bits per cell (e.g., 3, 4 or more). In general, the number of required data latches for each bit line is equal to one more than the number of bits stored by each individual memory cell. A single extra latch is utilized for the purpose of identifying the origin of the currently stored data.

In FIGS. 21A-21B, two data latches labeled DL0 and DL1 are used for each bit line to store data read from the memory cells of the corresponding bit line. A third data latch labeled DL2 is used to store a flag that indicates whether the data currently stored in data latches DL0 and DL1 corresponds to data from the selected word line WLm, or whether the data corresponds to data from the word line WLm+1 adjacent to the selected word line.

The read operation begins by reading the adjacent word line WLm+1 at STEP 700. The neighboring word line can be read at the three normal reference levels $D_A$, $D_B$ and $D_C$ shown in FIG. 11(0). No compensation is applied when reading WLm+1 in one embodiment. The data values for the memory cells of the adjacent word line are determined at STEP 702. The data value for the memory cell of each bit line at word line WLm+1 is stored in a corresponding set of data latches DL0 and DL1 for that bit line at STEP 704. At STEP 706, the third data latch DL2 for each bit line is set to logic 0 to indicate that the data in data latches DL0 and DL1 corresponds to data from a memory cell at WLm+1.

A group of sub-reads, one for each of the four possible neighboring states of WLm+1 will be performed on WLm at each of the demarcation threshold levels to distinguish between two states at WLm.

Thus, the group of sub-reads at the state "A" level (between states "Gr" and "A") is performed for the selected word line WLm at STEPs 708-722. The first sub-read at STEP 708 provides no compensation to account for floating gate coupling.

At STEP 710, the processor for each bit line determines whether to update the data latches for the bit line. For bit lines where the memory cell of the selected word line was nonconductive during the sub-read at STEP 708, the processor does not change any values stored in the data latches. For bit lines where the memory cell was conductive, the processor determines if data latches DL0 and DL1 are currently storing data corresponding to state "Gr". For instance, if the data assignments of FIG. 11(3) are used, the processor determines if the latches are both storing a logic 1. If the latches are not storing logic 11, the processor does not change the values in the data latches. If both latches are storing 11, the processor determines if the third data latch DL2 is storing a logic 0. A logic 0 indicates that latches DL0 and DL1 are storing data from WLm+1 and should be overwritten. The processor may check latch DL2 first and only check latches DL0 and DL1 if DL2 is storing a logic 0 in one embodiment. If both conditions are met for a conductive memory cell, DL0 and DL1 are set to the predetermined data values for the erased state. The third data latch DL2 is set to 1 to indicate that DL0 and DL1 are now storing data for word line WLm. A logic 1 in DL2 precludes latches DL0 and DL1 from being overwritten during subsequent sub-reads.

At STEP 712, another state "A" sub-read is performed. This time, a compensation corresponding to adjacent memory cells at WLm+1 that are programmed to state "A" is applied.

The processor at each bit line performs another logic sequence to determine whether to update the latch for bit lines having a conductive memory cell. If DL0 and DL1 are not storing data for state "A" (e.g., 10), no action is taken. If they are, the processor determines if DL2 is storing a 0 to indicate that WLm+1 data is currently stored. If DL2 is set to 0, the processor overwrites DL0 and DL1 with data for state "Gr". The processor sets DL2 to 1 to indicate that the latches now store the data from WLm.

At STEP 716, a state "A" sub-read is performed at WLm while applying a compensation based on cells at WLm+1 that are programed to state "B". For conductive memory cells, the corresponding bit line processor determines if DL0 and DL1 are storing data corresponding to state "B" (e.g., 00). If not, no action is taken. If so, the processor determines if DL2 is storing logic 0. If not, no further action is taken. If DL2 is set to 0, DL0 and DL1 are overwritten with predetermined data for state "Gr" and DL2 is set to 1 to indicate that the latches are now storing data from WLm.

At STEP 720, a final sub-read at the state "A" level is performed. A compensation based on adjacent cells at WLm+1 in state "C" is applied. For conductive memory cells, the corresponding bit line processor determines if the latches are storing data for state 1 (e.g., 01). If DL2 is set to 2, no action is taken. If DL2 is set to 0, the processor determines if DL2 is storing 0. If not, no further action is taken. If so, the processor overwrites DL0 and DL1 with the predetermined data for state "Gr" and sets DL2 to 1.

At STEPs 724-744, a sequence of sub-reads at the state "B" level are performed for word line WLm.

An initial sub-read at STEP 724 provides no compensation for floating gate coupling. The results of this sub-read are applicable to those cells having an adjacent cell at WLm+1 that is in erased state "Gr". For conductive memory cells, the corresponding processor determines if DL0 and DL1 for the bit line are storing data for state "Gr". This step checks to determine that the current sensing at WLm is the one from which data should be stored for the cell. If DL0 and DL1 do not correspond to state "Gr", no action is taken. If DL0 and DL1 match for state "Gr", the processor determines if DL2 is storing logic 0 to indicate that the data in DL0 and DL1 is for WLm+1 and not the selected word line WLm. If DL2 is set to 1, the processor does not overwrite the data in DL0 and DL1. Logic 1 indicates that the DL0 and DL1 data is from WLm, and thus, should not be overwritten. If DL2 is set to 0, the processor overwrites the data in DL0 and DL1 with the data for the current set of sub-reads at STEP 726. In this case, the processor sets DL0 and DL1 to the state "A" data (e.g., 10). The processor will also set DL2 to 1 to indicate that DL0 and DL1 are now storing data from the selected word line WLm and should not be overwritten during subsequent sub-reads at WLm.

At STEP 728, a state "B" sub-read is performed at word line WLm while applying a compensation based on adjacent cells at WLm+1 in state "A". For conductive memory cells, the processor for the corresponding bit line determines if DL0 and DL1 are storing data for state "A". If not, no action is taken. If so, the processor determines if DL2 is storing logic 0. If not, no further action is taken for the bit line. If so, the processor overwrites the data in DL0 and DL1 with data corresponding to state "A". The processor also sets DL2 to logic 1.

At STEP 732, WLm is read while applying a compensation for memory cells with an adjacent cell at WLm+1 in state "B". If a memory cell is conductive, the processor for the corresponding bit line determines if DL0 and DL1 for that bit line are sharing state "B" data (e.g., 00). If they are, the processor determines whether the data in DL0 and DL2 is from WLm (DL2=1) or WLm+1 (DL2=0). If the data is from WLm+1, the processor overwrites DL0 and DL1 with predetermined data for state "A". The processor also sets DL2 to logic 1. If either condition is not met, the processor does not alter the contents of DL0-DL2.

At STEP 736, a state "B" sub-read is performed at WLm while applying a compensation based on adjacent cells at WLm+1 in state "C". For conductive memory cells, the processor determines if DL0 and DL1 are storing data for state "C" (e.g., 01). If not, no action is taken. If so, the processor determines if DL2 is storing logic 0. If not, no action is taken. If so, the processor overwrites the data in DL0 and DL1 with the data for state "A" and sets DL2 to logic 1.

STEPs 740-756 perform a set of sub-reads at the state "C" read reference voltage level.

A first sub-read is performed at STEP 740 that includes no compensation for floating gate coupling. For conductive memory cells, the corresponding bit line processor determines if latches DL0 and DL1 store data for state "Gr". If not, no action is taken at that bit line. If so, the processor determines if DL2 is storing logic 0. If not, the data latches are not changed since they already share data for WLm. If DL2 is set to 0, the corresponding processor overwrites the data in DL0 and DL1 with predetermined data corresponding to state "B" (e.g., 00). The processor also sets DL2 to 1 to indicate that DL0 and DL1 are now storing WLm data.

At STEP 744, a state "C" sub-read is preformed while applying a compensation based on adjacent memory cells is in state "A". For conductive cells, the bit line processor determines if DL0 and DL1 are storing data for state "A". If not, no action is taken. If so, the processor overwrites latches DL0 and DL1 with data for state "B", and sets DL2 to logic 1.

At STEP 748, a state "C" sub-read is preformed while applying a compensation based on adjacent memory cells is in state "B". For conductive cells, the bit line processor determines if DL0 and DL1 are storing data for state "B". If not, no action is taken. If so, the processor overwrites latches DL0 and DL1 with data for state "B", and sets DL2 to logic 1.

At STEP 752, a final state "C" sub-read is preformed while applying a compensation based on adjacent memory cells is in state "C". For conductive cells, the bit line processor determines if DL0 and DL1 are storing data for state "C". If not, no action is taken. If so, the processor overwrites latches DL0 and DL1 with data for state "C", and sets DL2 to logic 1.

A final logic sequence is performed at STEP 756. The bit processors determine if the third data latch DL2 for any bit line is set to 0. Any bit lines still storing 0 in DL2 have memory cells at WLn that were not conductive during any of the sub-reads at any of the state levels. Accordingly, these memory cells are in the highest programmed state, state "C". The processors for these bit lines set DL0 and DL1 to the data for state "C" (e.g., logic 01 in the LM code) and then set DL2 to 1 to indicate that the latches now store data for WLn.

The technique of performing LA read using n+1 latches for n-bit memory has been described with respect to the 2-bit example shown in FIGS. 21A-21B. It will be clear that similar techniques are readily applicable to other values of n, such as n=3 or higher. In some implementations, where some memory states have wider margin between them or are more robust to perturbation, not all compensations need be applied to save time.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

Although the various aspects of the present invention have been described with respect to certain embodiments, it is understood that the invention is entitled to protection within the full scope of the appended claims.

It is claimed:

1. In a non-volatile memory having an array of memory cells, wherein individual memory cells are each programmable to one of multiple memory states, a method of copying a group of data from a first memory cell group to a second memory cell group, comprising:

providing a multi-bit code having multiple code bits for encoding each of the multiple memory states;

predetermining a bit order of the code bits such that as more of the higher order code bits are available, more of the higher programmed states are decodable;

reading from memory cells of the first memory cell group to determine the memory states therein;

encoding each read memory state as multi-bit data with the multi-bit code;

latching the multi-bit data of every memory cell of the first memory cell group;

grouping the latched data into as many data groups as the number of code bits, each data group collecting a same code bit from every memory cell of the first memory cell group;

processing the data groups, data group by data group according to the predetermined code bit order, by outputting the bits of each data group to a controller for data-processing and returning any modified bits to update each data group;

if any data group has been processed, simultaneously with any additional data group processing, programming individual memory cells of the second memory cell group up to a highest memory state decodable by available code bits from the processed data groups; and repeating said processing and said programming until all code bits of the multi-bit code are available to complete said programming.

2. The method as in claim 1, further comprising:

providing a set of latches for latching the multi-bit data of each memory cell of the memory cell group, the set of latches having capacity just for the multiple code bits plus an additional bit.

3. The method as in claim 1, wherein said reading including correcting for any perturbative effects due to memory cells of a neighboring word line.

4. The method as in claim 1, wherein the multi-bit code contains two bits.

5. The method as in claim 1, wherein the multi-code contains three bits.

6. The method as in claim 1, wherein the multi-code contains four bits.

7. The method as in claim 1, wherein the array of memory cells is organized into a plurality of erasable blocks of memory cells, and the first memory cell group and the second memory cell group belong to different erasable blocks.

8. The method as in claim 1, wherein the array of memory cells is organized into a plurality of erasable blocks of memory cells, and the first memory cell group and the second memory cell group belong to the same erasable block.

9. The method as in claim 1, wherein the non-volatile memory is a flash EEPROM.

10. The method as in claim 1, wherein the non-volatile memory has a NAND structure.

11. The method as in claim 1, wherein the non-volatile memory is on a removable memory card.

12. The method as in claim 1, wherein the non-volatile memory has memory cells with a floating gate structure.

13. The method as in claim 1, wherein the non-volatile memory comprises memory cells with a dielectric layer structure.

14. The method as in claim 2, wherein said reading including correcting for any perturbative effects due to memory cells of a neighboring word line.

15. The method as in claim 2, wherein the multi-bit code contains two bits.

16. The method as in claim 2, wherein the multi-code contains three bits.

17. The method as in claim 2, wherein the multi-code contains four bits.

18. The method as in claim 2, wherein the array of memory cells is organized into a plurality of erasable blocks of memory cells, and the first memory cell group and the second memory cell group belong to different erasable blocks.

19. The method as in claim 2, wherein the array of memory cells is organized into a plurality of erasable blocks of memory cells, and the first memory cell group and the second memory cell group belong to the same erasable block.

20. The method as in claim 2, wherein the non-volatile memory is a flash EEPROM.

21. The method as in claim 2, wherein the non-volatile memory has a NAND structure.

22. The method as in claim 2, wherein the non-volatile memory is on a removable memory card.

23. The method as in claim 2, wherein the non-volatile memory has memory cells with a floating gate structure.

24. The method as in claim 2, wherein the non-volatile memory comprises memory cells with a dielectric layer structure.

* * * * *